(12) United States Patent
Wood et al.

(10) Patent No.: US 8,853,072 B2
(45) Date of Patent: Oct. 7, 2014

(54) METHODS OF FORMING THROUGH-SUBSTRATE INTERCONNECTS

(75) Inventors: Alan G. Wood, Boise, ID (US); Philip J. Ireland, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 178 days.

(21) Appl. No.: 13/154,132

(22) Filed: Jun. 6, 2011

(65) Prior Publication Data

US 2012/0306084 A1 Dec. 6, 2012

(51) Int. Cl.
*H01L 23/48* (2006.01)
*H01L 23/00* (2006.01)
*H01L 21/768* (2006.01)

(52) U.S. Cl.
CPC ....... *H01L 24/03* (2013.01); *H01L 2224/05096* (2013.01); *H01L 2224/05026* (2013.01); *H01L 2224/03444* (2013.01); *H01L 2224/03452* (2013.01); *H01L 2224/05655* (2013.01); *H01L 2224/05025* (2013.01); *H01L 2224/05022* (2013.01); *H01L 2224/03462* (2013.01); *H01L 2224/05157* (2013.01); *H01L 2224/0348* (2013.01); *H01L 24/05* (2013.01); *H01L 2224/03845* (2013.01); *H01L 23/481* (2013.01); *H01L 2224/05009* (2013.01); *H01L 2224/05187* (2013.01); *H01L 2224/05181* (2013.01); *H01L 2224/0345* (2013.01); *H01L 2224/05644* (2013.01); *H01L 2224/05027* (2013.01); *H01L 2224/05094* (2013.01); *H01L 21/76898* (2013.01); *H01L 2224/05083* (2013.01); *H01L 2224/05176* (2013.01); *H01L 2224/05147* (2013.01); *H01L 2224/0347* (2013.01)
USPC ............... 438/618; 257/761; 257/E23.011

(58) Field of Classification Search
CPC ............ H01L 23/481; H01L 21/76898; H01L 2224/05647; H01L 2924/014; H01L 2224/94; H01L 2225/06541; H01L 2224/05083; H01L 2224/0401; H01L 24/03; H01L 2224/0345; H01L 2224/16145; H01L 2924/01074
See application file for complete search history.

(56) References Cited

U.S. PATENT DOCUMENTS 5,496,691 A * 3/1996 Miyamoto et al. ............ 430/539
6,114,240 A * 9/2000 Akram et al. ................. 438/667

(Continued)

FOREIGN PATENT DOCUMENTS

WO PCT/US2012/036401 11/2012

OTHER PUBLICATIONS

Abstract: Liu et al., "Failure mechanisms and optimum design for electroplated copper Through-Silicon Vias (TSV)", Electronic Components and Technology, May 26-29, 2009, pp. 624-629.

(Continued)

*Primary Examiner* — Stephen W Smoot
*Assistant Examiner* — Edward Chin
(74) *Attorney, Agent, or Firm* — Wells St. John P.S.

(57) ABSTRACT

Some embodiments include methods of forming interconnects through semiconductor substrates. An opening may be formed to extend partway through a semiconductor substrate, and part of an interconnect may be formed within the opening. Another opening may be formed to extend from a second side of the substrate to the first part of the interconnect, and another part of the interconnect may be formed within such opening. Some embodiments include semiconductor constructions having a first part of a through-substrate interconnect extending partially through a semiconductor substrate from a first side of the substrate; and having a second part of the through-substrate interconnect extending from a second side of the substrate and having multiple separate electrically conductive fingers that all extend to the first part of the interconnect.

26 Claims, 17 Drawing Sheets

(56) References Cited

U.S. PATENT DOCUMENTS

| | | | |
|---|---|---|---|
| 6,135,679 A | 10/2000 | Kazda | |
| 6,284,122 B1 * | 9/2001 | Memmi et al. | 205/220 |
| 6,943,106 B1 | 9/2005 | Kirby et al. | |
| 7,026,721 B2 * | 4/2006 | Chen | 257/779 |
| 7,193,327 B2 * | 3/2007 | Yu et al. | 257/774 |
| 7,198,996 B2 * | 4/2007 | Nakatani et al. | 438/184 |
| 7,279,419 B2 * | 10/2007 | Kim et al. | 438/668 |
| 7,410,898 B2 * | 8/2008 | Kirby et al. | 438/667 |
| 7,626,269 B2 | 12/2009 | Oliver et al. | |
| 7,640,660 B2 * | 1/2010 | Abe et al. | 29/847 |
| 7,855,140 B2 | 12/2010 | Watkins et al. | |
| 7,884,013 B2 * | 2/2011 | Tseng et al. | 438/639 |
| 8,252,680 B2 * | 8/2012 | Lavoie | 438/643 |
| 2001/0011575 A1 * | 8/2001 | Nakata et al. | 156/272.2 |
| 2003/0207558 A1 * | 11/2003 | Bao et al. | 438/622 |
| 2004/0018712 A1 * | 1/2004 | Plas et al. | 438/612 |
| 2005/0221601 A1 | 10/2005 | Kawano | |
| 2007/0290300 A1 * | 12/2007 | Kawakami | 257/621 |
| 2010/0148371 A1 * | 6/2010 | Kaskoun et al. | 257/777 |
| 2010/0224985 A1 * | 9/2010 | Michael et al. | 257/692 |
| 2010/0264548 A1 * | 10/2010 | Sanders et al. | 257/774 |
| 2010/0267199 A1 * | 10/2010 | Hatakeyama et al. | 438/107 |
| 2011/0018114 A1 | 1/2011 | Pagaila et al. | |
| 2011/0147059 A1 * | 6/2011 | Ma et al. | 174/258 |
| 2011/0207323 A1 * | 8/2011 | Ditizio | 438/675 |
| 2012/0083119 A1 * | 4/2012 | Komuro | 438/667 |
| 2012/0187567 A1 * | 7/2012 | Lee et al. | 257/774 |

OTHER PUBLICATIONS

Yole Developpement, "3-D IC Commercialization Continues Despite Downturn", Semiconductor International. Retrieved Apr. 7, 2011 from http://www.semiconductor.net/article/453107-3_D_IC_Commercialization_Continues_Despite_Downturn-.

* cited by examiner

US 8,853,072 B2

METHODS OF FORMING THROUGH-SUBSTRATE INTERCONNECTS

TECHNICAL FIELD

Semiconductor constructions having through-substrate interconnects, and methods of forming through-substrate interconnects.

BACKGROUND

Commercial production of integrated circuit devices, such as memory dice, may involve fabrication of a large number of identical circuit patterns on a single semiconductor wafer or other bulk semiconductor substrate. It is a continuing goal of semiconductor manufacturers to increase the density of semiconductor devices fabricated on a given size of semiconductor substrate to achieve increased yield of semiconductor devices and enhanced performance thereof.

One method for increasing the density of semiconductor devices in a semiconductor assembly is to create vias (i.e., through-holes) that extend entirely through a semiconductor die; and specifically that extend from an active surface of the die to the opposing backside surface of the die. The vias are filled with an electrically conductive material to form through-substrate interconnects that provide electrical pathways from the active surface of the die to the backside surface of the die. The through-substrate interconnects may be electrically coupled to electrical contacts that are along the backside of the die, and that extend to circuit components external of the die. In some applications, the die may be incorporated into a three-dimensional multichip module (3-D MCM), and the circuit components external of the die may be comprised by another semiconductor die and/or by a carrier substrate.

Various methods for forming vias in semiconductor substrates have been disclosed. For instance, U.S. Pat. Nos. 7,855,140, 7,626,269 and 6,943,106 describe example methods that may be utilized to form through-substrate interconnects.

Thermally-induced problems may occur with conventionally-formed through-substrate interconnects. Such problems may result from stresses occurring as a result of the different rates of thermal expansion of the conductive materials within the interconnects (for instance, copper) relative to other materials of a semiconductor die. It would be desirable to develop new through-substrate interconnect architectures which alleviate or prevent such thermally-induced problems, and to develop methods for fabricating such architectures.

BRIEF DESCRIPTION OF THE DRAWINGS

FIG. 21 is a diagrammatic, cross-sectional view of a semiconductor construction at a process stage of another example embodiment method of forming a through-substrate interconnect.

FIG. 22 is a diagrammatic, cross-sectional view of a semiconductor construction at a process stage of another example embodiment method of forming a through-substrate interconnect.

DETAILED DESCRIPTION OF THE ILLUSTRATED EMBODIMENTS

Some embodiments include through-substrate interconnects that are subdivided into at least two separate electrically conductive components which join in an interior region of a substrate. Subdividing the through-substrate interconnects into at least two separate components may address problems discussed above in the "Background" section of this disclosure; and specifically may alleviate, or even prevent, the thermally-induced problems associated with conventionally-formed through-substrate interconnects. Some embodiments include anchor pins which are formed simultaneously with components of the through-substrate interconnects.

Example embodiments are described with reference to FIGS. 1-32.

Figure 1:
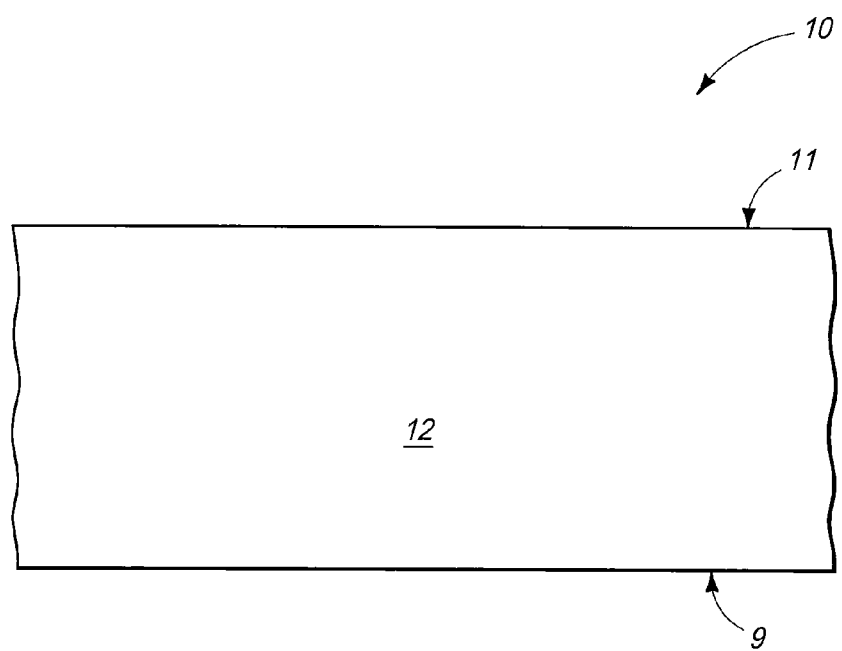
FIGS. 1-8 and 10-14 are diagrammatic, cross-sectional views of a semiconductor construction at various process stages of an example embodiment method of forming a through-substrate interconnect.

Referring to FIG. 1, a portion of a semiconductor construction 10 is illustrated. The construction 10 may be part of a semiconductor wafer. The construction 10 comprises a semiconductor substrate 12 having integrated circuitry (not shown) associated therewith. The substrate 12 comprises semiconductor material; and may, for example comprise a monocrystalline silicon base (such as a region of a monocrystalline silicon wafer). The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

The substrate 12 has a first side 9 and an opposing second side 11.

The integrated circuitry associated with substrate 12 is not shown in order to simplify the drawing. The circuitry may comprise any integrated circuit components either now-known, or later-developed; including, for example, memory, logic, wiring, etc. The various circuit components may comprise any of numerous materials; including, for example, one or more of refractory metal materials, barrier materials, diffusion materials, insulator materials, etc. The integrated circuit components may be primarily along one or the other of the sides 9 and 11. The side having the integrated circuitry associated therewith may be referred to as a front side (or active side) of the semiconductor substrate 12, and the other side may be referred to as a backside of the substrate. In some embodiments, the first side 9 may correspond to the front side of the substrate.

Figure 2:
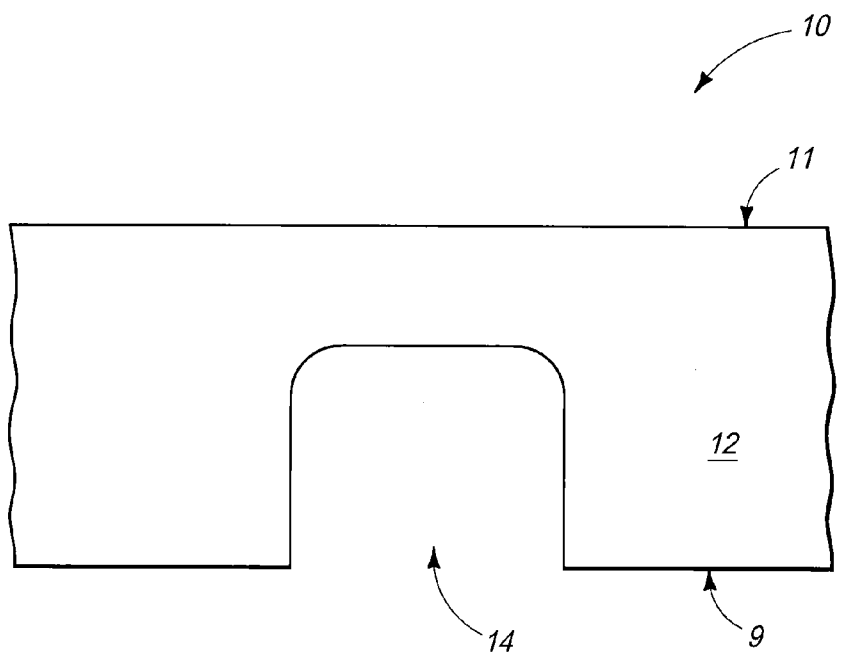

Referring to FIG. 2, an opening 14 is formed to extend partially into substrate 12 from the first side 9 of the substrate. Such opening may be formed utilizing any suitable processing. For instance, a photolithographically-patterned photoresist mask (not shown) may be formed over side 9 to define a location of the opening, then one or more etches may be utilized to pattern the opening within substrate 12, and subsequently the photoresist mask may be removed to leave the construction of FIG. 2.

The opening 14 to be formed to any suitable distance within substrate 12. In some embodiments, the opening 14 may be formed to extend more than halfway through substrate 12 (as shown), and in other embodiments the opening 14 may be formed to extend less than or equal to halfway through the substrate 12.

Figure 3:
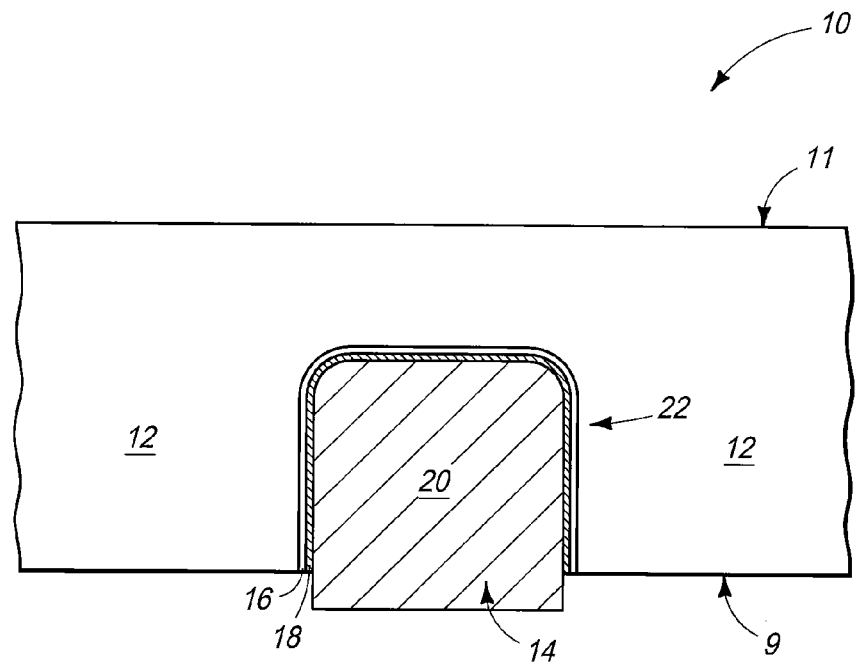

Referring to FIG. 3, an electrically insulative liner 16 is formed within opening 14, and then conductive materials 18 and 20 are formed within the lined opening.

The electrically insulative liner may comprise any suitable composition or combination of compositions; and in some embodiments may comprise a doped glass; such as, for example, one or more of borophosphosilicate glass (BPSG), phosphosilicate glass (PSG), fluorosilicate glass (FSG), etc. The liner 16 may be formed to any suitable thickness, and in some embodiments may be formed to a thickness within a range of from about 1000 angstroms to about 3000 angstroms; such as, for example, a thickness of about 1700 angstroms.

The electrically conductive materials 18 and 20 may comprise any suitable compositions or combinations of compositions. In some embodiments the electrically conductive material 20 may comprise, consist essentially of, or consist of copper; and the material 18 may be a copper barrier material. The copper barrier material may include one or more of cobalt, ruthenium, tantalum, tantalum nitride, tungsten nitride and titanium nitride. The electrically conductive materials 18 and 20 together form a first part 22 of an electrically conductive interconnect. In some embodiments, the conductive material 20 may be referred to as a core of the first part of the electrically conductive interconnect, and the material 18 may be referred to as a sheath that extends around such core.

The remaining discussion of the figures in this application may refer to core 20 as a copper-containing core, and to the material 18 as a copper barrier sheath around such core. However, the invention also includes embodiments in which other electrically conductive materials may be utilized in addition to, or alternatively to, the copper-containing cores and copper barrier sheaths. In embodiments in which the cores are replaced with non-copper material, the copper barrier sheaths may be omitted.

The core 20 is illustrated to project slightly outside of the opening 14 in the illustrated embodiment, and thus to extend outwardly beyond the side 9 of the semiconductor substrate. In other embodiments, the core may be formed to be flush with the side 9 of the substrate, or recessed relative to the side 9 of the substrate.

Figure 4:
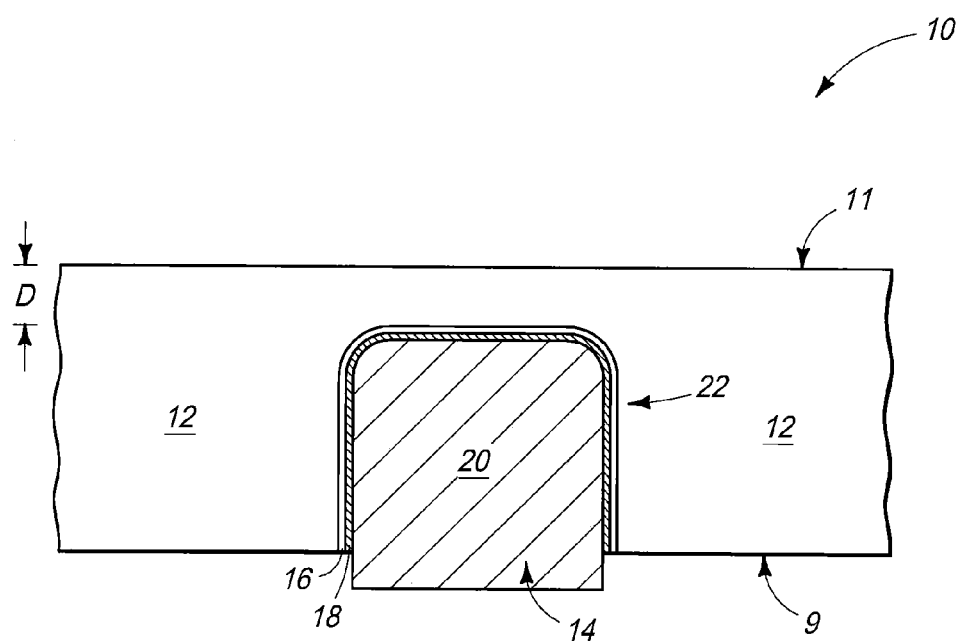

Referring to FIG. 4, the substrate 12 may be thinned so that a distance, D, from the second side 11 of the substrate to the first part 22 of the electrically conductive interconnect is less than or equal to about 20 micrometers. In some embodiments, the thinning of the substrate may be omitted.

Figure 5:
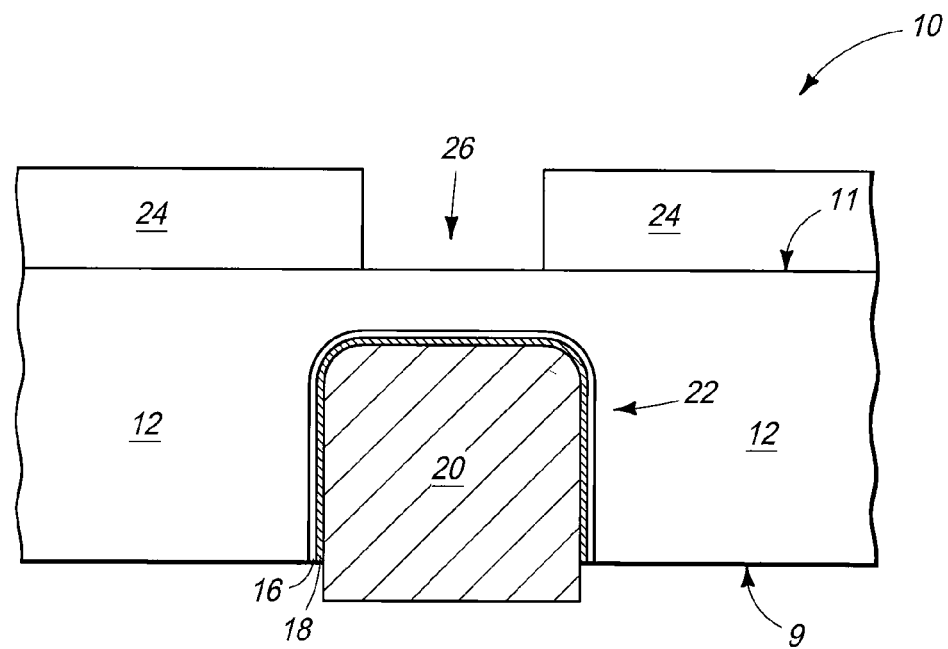

Referring to FIG. 5, patterned masking material 24 is provided over the second side 11 of substrate 12. An opening 26 extends through the patterned masking material, with such opening being directly over the first part 22 of the interconnect. The masking material 24 may comprise any suitable composition or combination of compositions; and in some embodiments may correspond to photolithographically-patterned photoresist.

Figure 6:
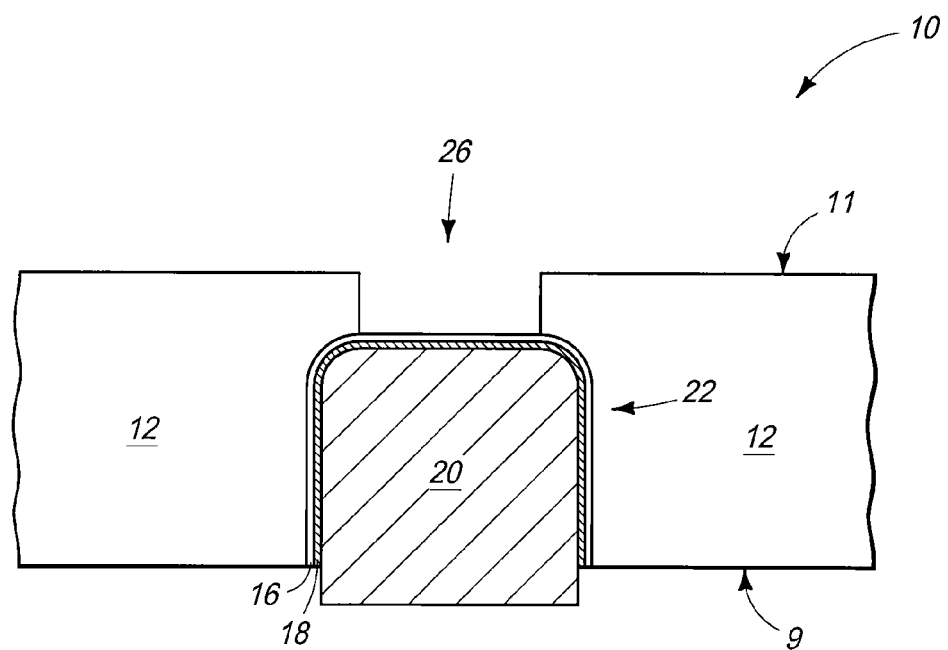

Referring to FIG. 6, the opening 26 is extended into the substrate 12, and specifically is extended to the electrically insulative material 16. Subsequently, the masking material 24 (FIG. 5) is removed. The opening 26 may be extended into substrate 12 with any suitable etch, or combination of etches; and in some embodiments may be extended into the substrate utilizing a deep reactive ion etch (DRIE) process. The opening 26 of FIG. 6 may be referred to as a second opening, to distinguish it from the first opening 14 formed at the processing stage of FIG. 2. The opening 26 may be formed into or through the insulative material 16 in some embodiments.

Figure 7:
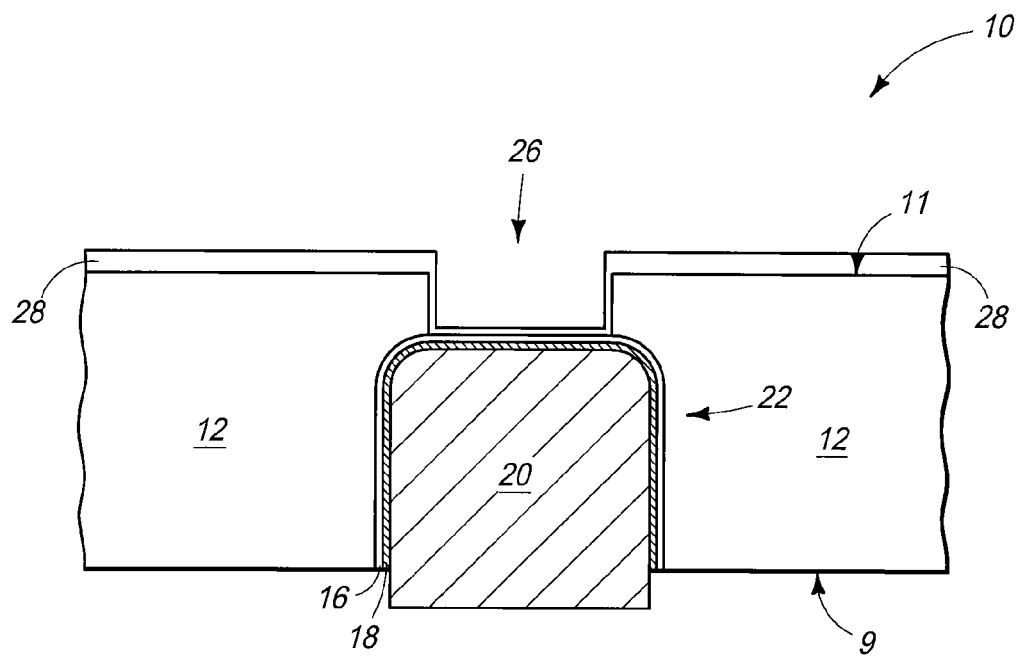

Referring to FIG. 7, electrically insulative material 28 is formed along the second side 11 of the substrate 12, and within the opening 26. The electrically insulative material 28 may comprise any suitable composition or combination of compositions; and in some embodiments may comprise, consist essentially of or consist of silicon dioxide or silicon nitride. The electrically insulative material may be formed with any suitable processing, including, for example, one or both of atomic layer deposition (ALD) and chemical vapor deposition (CVD). The deposition process may be a low-temperature process, and specifically may utilize a temperature of less than or equal to about 200° C. Such low-temperature processing may be desired in order to avoid thermally-induced damage to integrated circuit components associated with substrate 12.

The electrically insulative material 28 is formed to be thicker along the surface 11 of substrate 12 than along the bottom of opening 26. Such may occur if the opening 26 has a suitable aspect ratio such that the deposition along the bottom of opening 26 is slower than the deposition along the surface 11; and in some embodiments the opening 26 may have an aspect ratio of greater than or equal to 2:1. In some embodiments, the thickness of material 28 over surface 11 is at least about 5000 angstroms, and the thickness of material 28 along the bottom of opening 26 is less than or equal to about 3000 angstroms.

Figure 8:
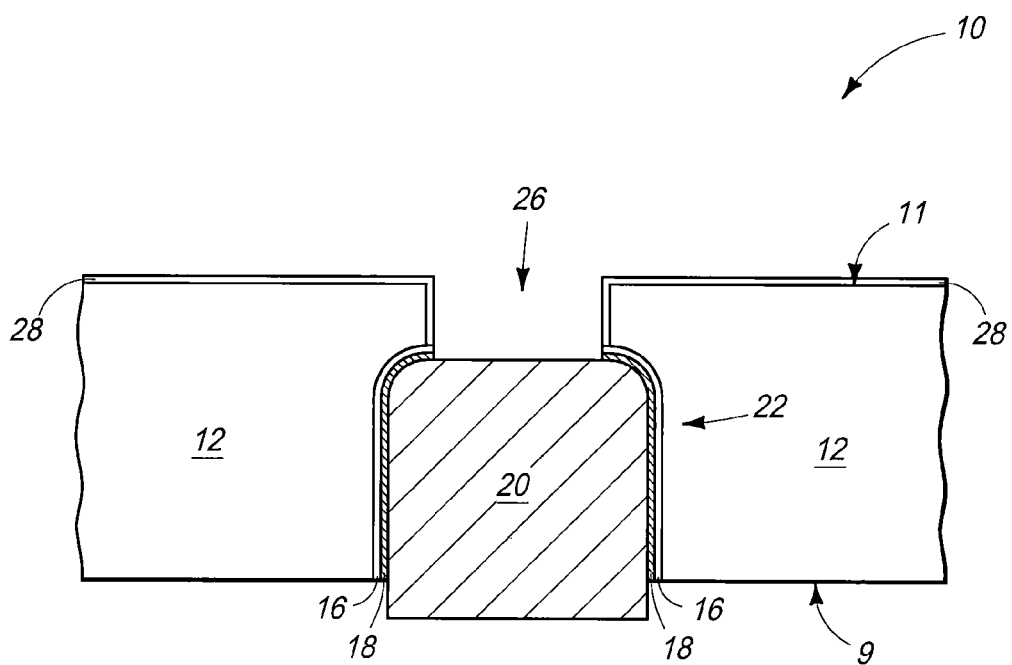

Referring to FIG. 8, the electrically insulative material 28 is subjected to an anisotropic etch which punches through the bottom of material 28, and also punches through liner 16 to expose the electrically conductive first part 22 of the interconnect. The electrical insulative material remains along sidewalls of opening 26, and across the surface 11 after the etch punches through the material 28 at the bottom of the opening 26. In the shown embodiment, etching is conducted to extend the opening 26 through the sheath 18 and to the core 20 of the first part of the electrical interconnect. In other embodiments discussed below with reference to FIGS. 15 and 16, the opening 26 may be extended to the sheath 18 rather than through the sheath 18.

Figure 9:
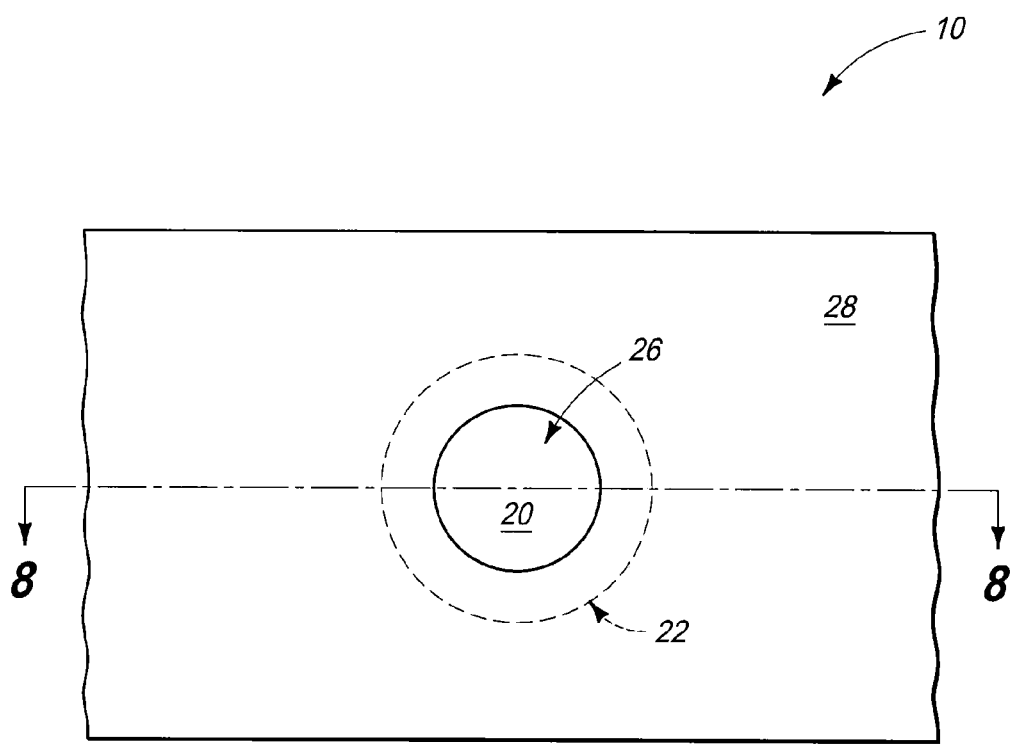
FIG. 9 is a diagrammatic top view of the construction of FIG. 8. The cross-section of FIG. 8 is along the line 8-8 of FIG. 9.

FIG. 9 shows a top view of the construction of FIG. 8, and shows the opening 26 relative to the first part 22 of the interconnect. The interconnect part 22 is shown in dashed-line to indicate that such is beneath other materials.

Figure 10:
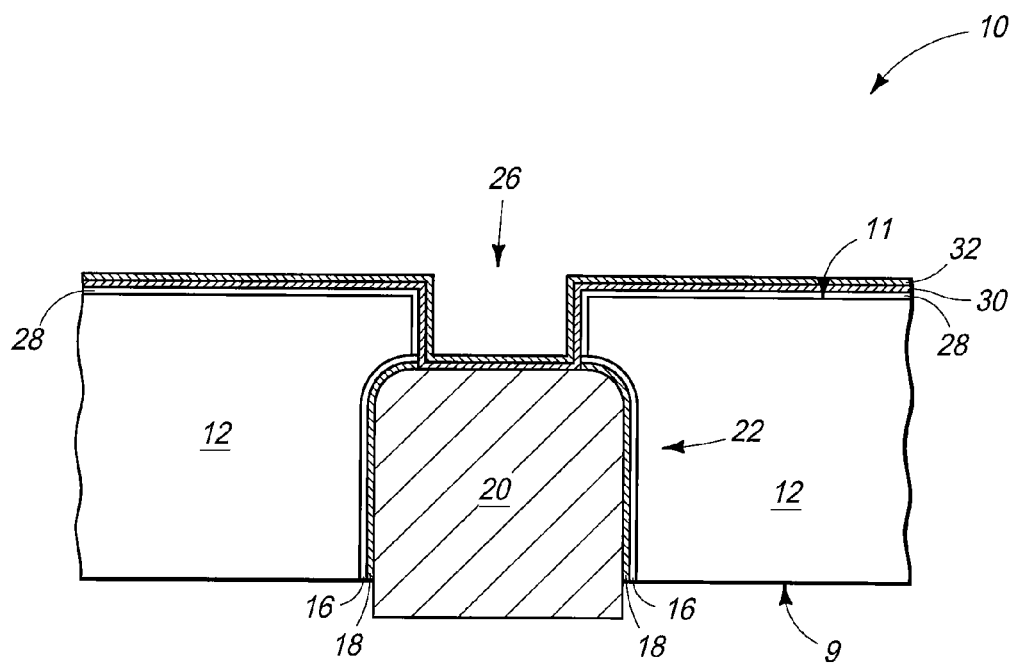

Referring to FIG. 10, electrically conductive materials are formed across the second side 11 of substrate 12, and within opening 26. Such electrically conductive materials may comprise a copper barrier material 30 and a copper seed material 32. The copper barrier material may comprise any of the materials discussed above as being suitable for utilization in copper barrier material 18, and may be formed with any suitable processing; including, for example, one or more of ALD, CVD and physical vapor deposition (PVD). The copper seed material may comprise any suitable seed material, and may be formed with any suitable processing; such as, for example, one or more of ALD, CVD and PVD.

Figure 11:
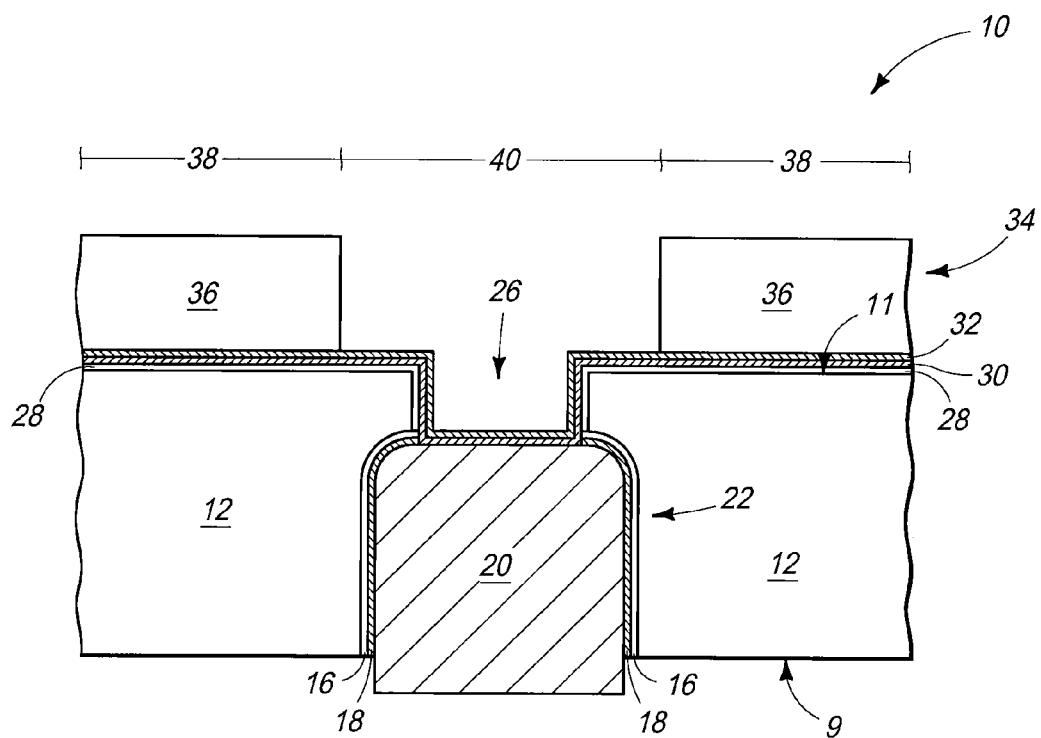

Referring to FIG. 11, a patterned mask 34 is formed over the second side 11 of substrate 12. The patterned mask comprises a masking material 36. The masking material 36 may be any suitable composition or combination of compositions; and in some embodiments may comprise photolithographically-patterned photoresist.

The patterned mask 34 covers a first region 38 of the second side of the substrate, while leaving a second region 40 uncovered. The opening 26 is within such uncovered second region.

Figure 12:
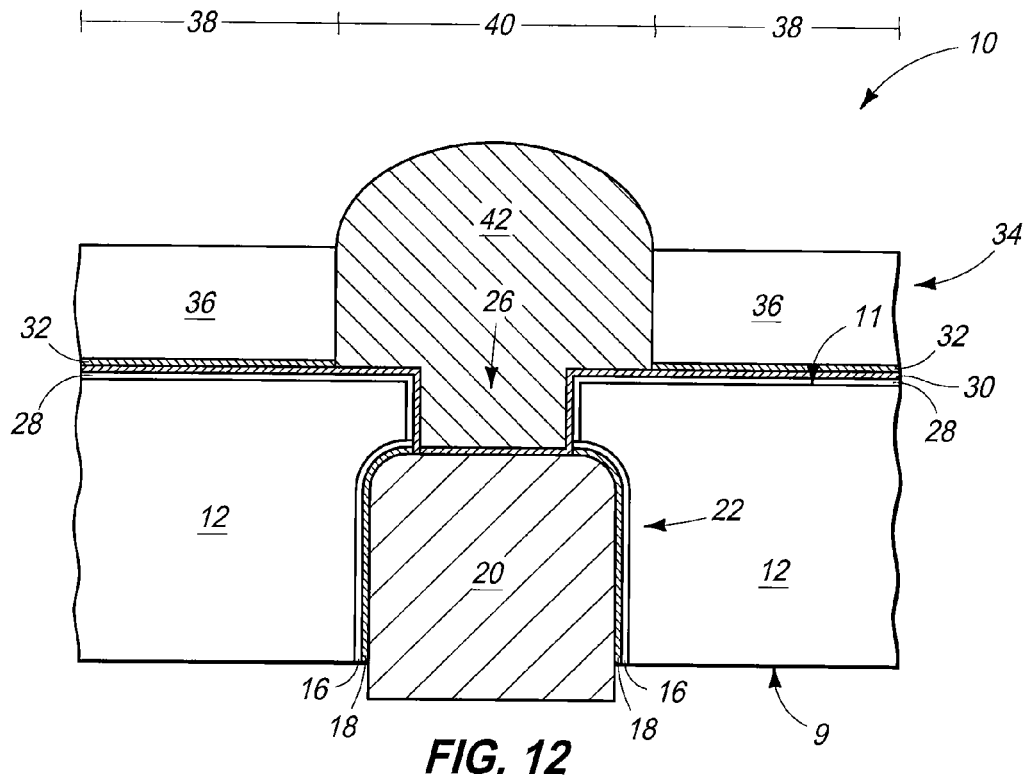

Referring to FIG. 12, electrically conductive material 42 is formed over the second side 11 of the substrate, and within the uncovered second region 40 of such second side. The material 42 may comprise, consist essentially of, or consist of copper; and may be electrolytically-grown from the copper seed material 32. In the embodiment of FIG. 12, the electrolytically-grown material 42 merges with the seed material within the uncovered region 40, so that the seed material within the uncovered region 40 effectively disappears as it becomes incorporated into the material 42.

The electrically conductive material 42 may be formed to any suitable thickness. In the shown embodiment, the material 42 is formed to a thickness exceeding the height of mask 34, but in other embodiments the material 42 may be formed to a thickness which does not exceed the height of the mask 34.

The discussion of the figures in this application may refer to material 42 as a copper-containing material, to the material 32 as a copper-containing seed material, and to the material 30 as a copper barrier material. However, the invention also includes embodiments in which other electrically conductive materials may be utilized in addition to, or alternatively to, the copper-containing materials and copper barrier materials. In embodiments in which the copper-containing materials 32 and 42 are replaced with non-copper materials, the copper barrier materials may be omitted.

Figure 13:
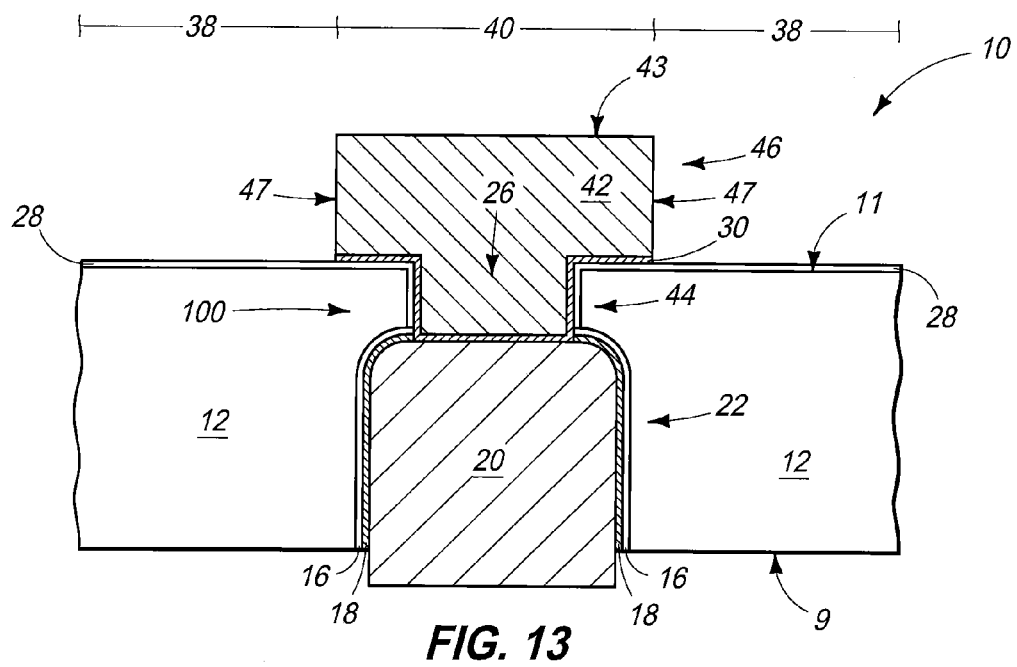

Referring to FIG. 13, material 42 is subjected to chemical-mechanical polishing (CMP) to form a planarized upper surface 43 extending across material 42, and the mask 34 (FIG. 12) is removed. Also, the copper barrier material 30 and seed material 32 (FIG. 12) are removed from the region 38 of substrate 12 that had been covered by mask 34.

The electrically conductive materials 30 and 42 are incorporated into a second part 44 of an electrical interconnect, with such second part of the electrical interconnect extending within the opening 26. The first and second parts 22 and 44 of the electrical interconnect are electrically coupled with one another, and together form a through-substrate interconnect 100.

The second part 44 of the electrical interconnect includes a pedestal 46 which is over the second side 11 of the substrate, and which has sidewalls 47.

In some embodiments, the second part 44 may be considered to comprise a core corresponding to material 42, and to comprise a sheath corresponding to the material 30 around the core. Thus, material 42 may be referred to as a core material of the second part 44 of the interconnect, and material 30 may be referred to as a sheath material of the second part of the interconnect. In some embodiments, the core 42 may be a copper-containing core, and the sheath 30 may be a copper barrier sheath.

Figure 14:
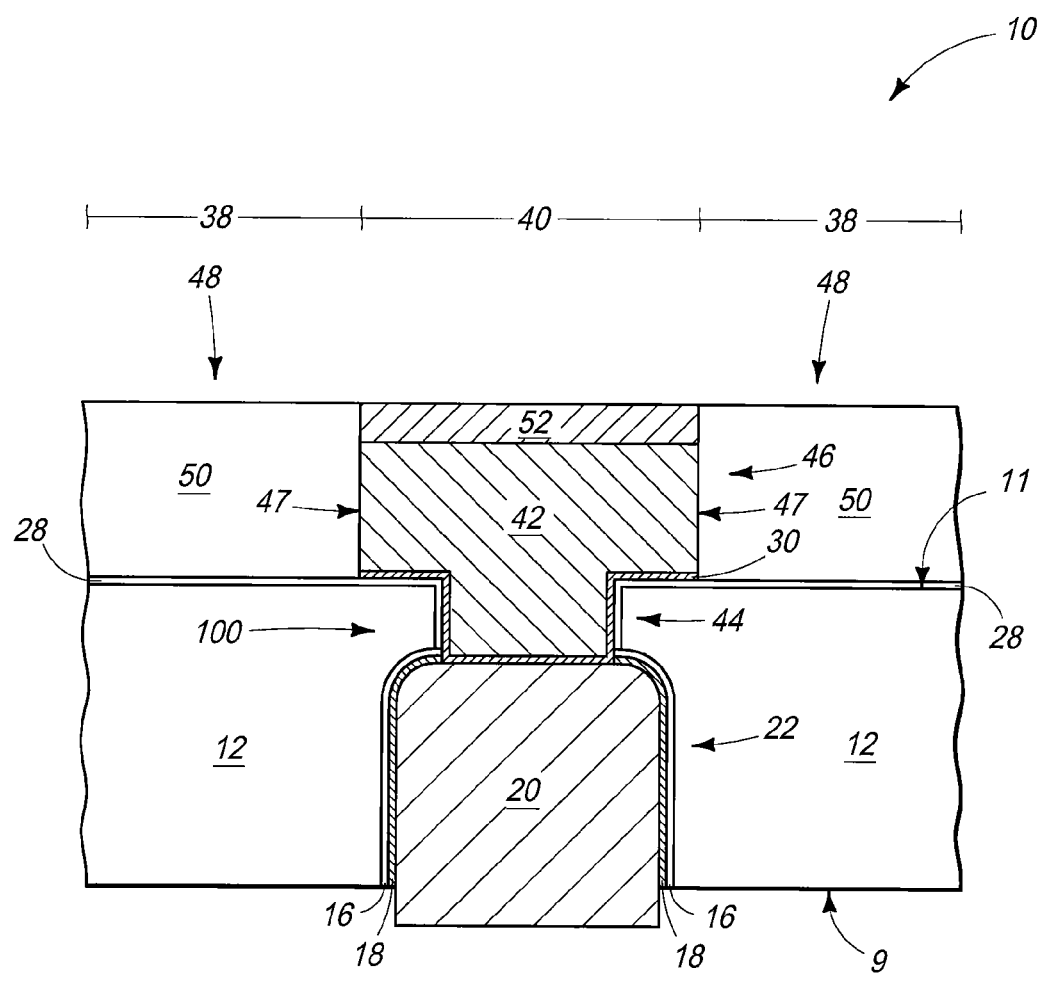

Referring to FIG. 14, an electrically insulative structure 48 is formed across the first region 38 of the substrate 12, and along the sidewalls 47 of the pedestal 46. The structure 48 comprises electrically insulative material 50. Such electrically insulative material may comprise any suitable composition or combination of compositions; and in some embodiments may comprise, consist essentially of, or consist of polyimide.

FIG. 14 shows a bonding material 52 formed over the electrically conductive core material 42. In some embodiments, such bonding material may comprise a solder-wettable material, and may be suitable for fabricating a bond to circuitry (not shown) external of the construction 10. Although the bonding material is shown provided directly over core material 42, in some embodiments there may be one or more other layers between the bonding material and the core material. Such other layers may comprise, for example, nickel, gold, or any other materials suitable for adhering the solder-wettable material to the core material; and in some embodiments may include materials known in the art as under bump materials.

Figure 15:
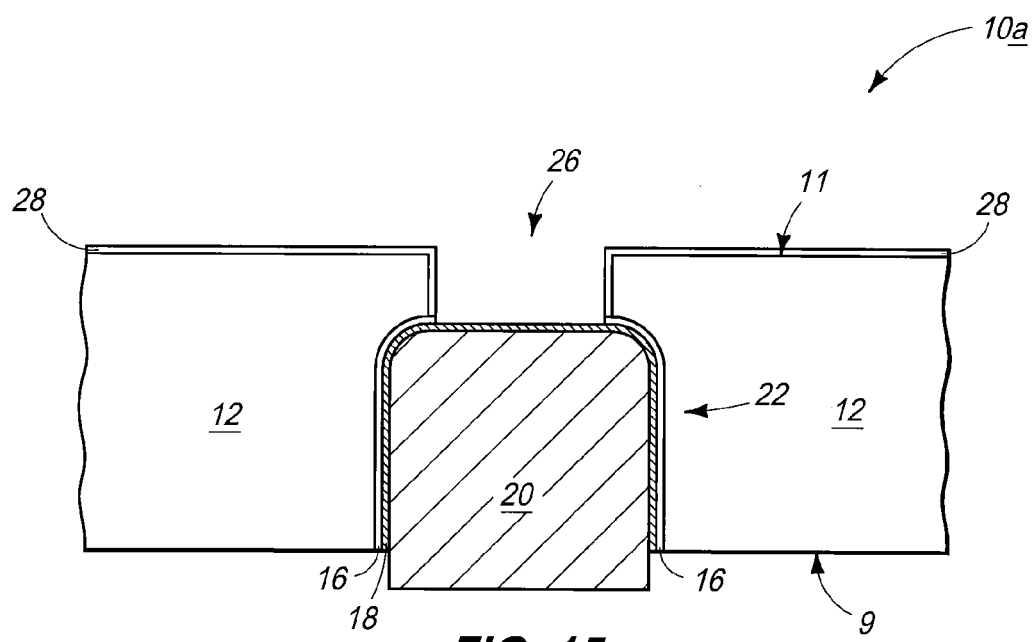
FIGS. 15 and 16 are diagrammatic, cross-sectional views of a semiconductor construction at various process stages of another example embodiment method of forming a through-substrate interconnect. The process stage of FIG. 15 may follow that of FIG. 7, and may be alternative to that of FIG. 8.
Figure 16:
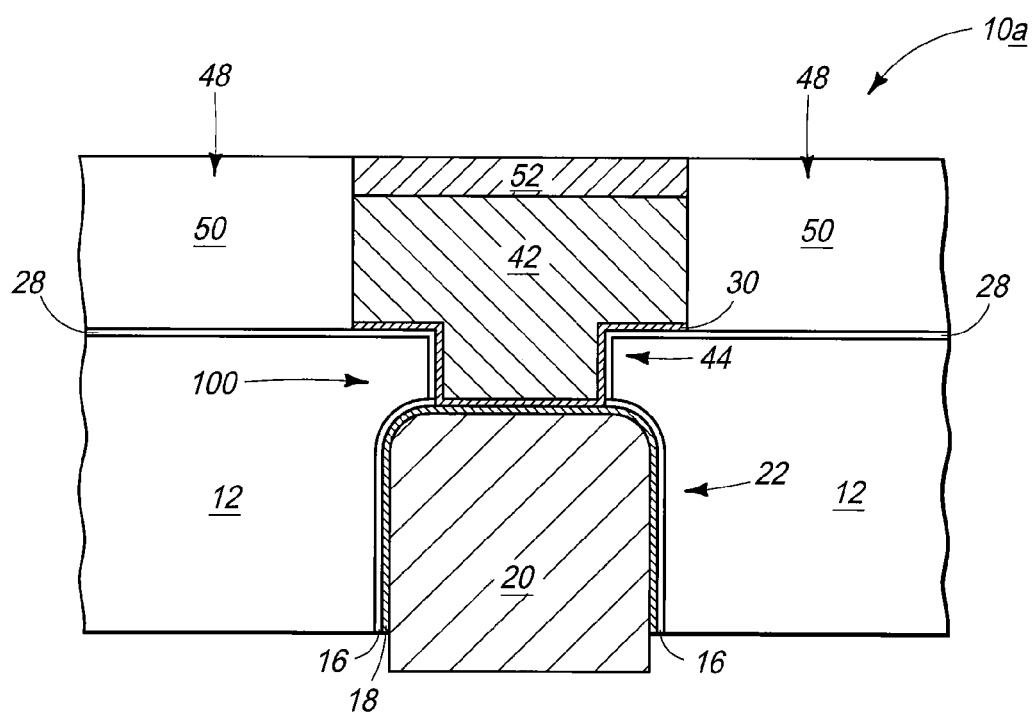

The fabrication stage of FIG. 8 shows opening 26 extended to core 20. In other embodiments, the opening 26 may be extended to the sheath 18, rather than entirely through the sheath to the core 20. FIGS. 15 and 16 illustrate an example of such other embodiments.

Referring to FIG. 15, such shows a construction 10a at a processing stage analogous to that of FIG. 8; but in which the opening 26 is extended to the electrically conductive sheath 18 of the first part 22 of the electrically conductive interconnect, and not to the core 20 of such first part of the electrically conductive interconnect.

FIG. 16 shows construction 10a at a processing stage analogous to that of FIG. 14 (specifically, after processing analogous to that described above with reference to FIGS. 10-14), and shows a second part 44 of the through-substrate interconnect 100 having an electrically conductive sheath 30 which joins to the electrically conductive sheath 18 of the first part 22 of the through-substrate interconnect.

The embodiments of FIGS. 1-16 form the second part of the electrical interconnect within a single opening. In other embodiments, the second part of the electrical interconnect may be formed within multiple openings. An example embodiment method for forming the second part of the electrical interconnect within multiple openings is described with reference to FIGS. 17-22.

Figure 17:
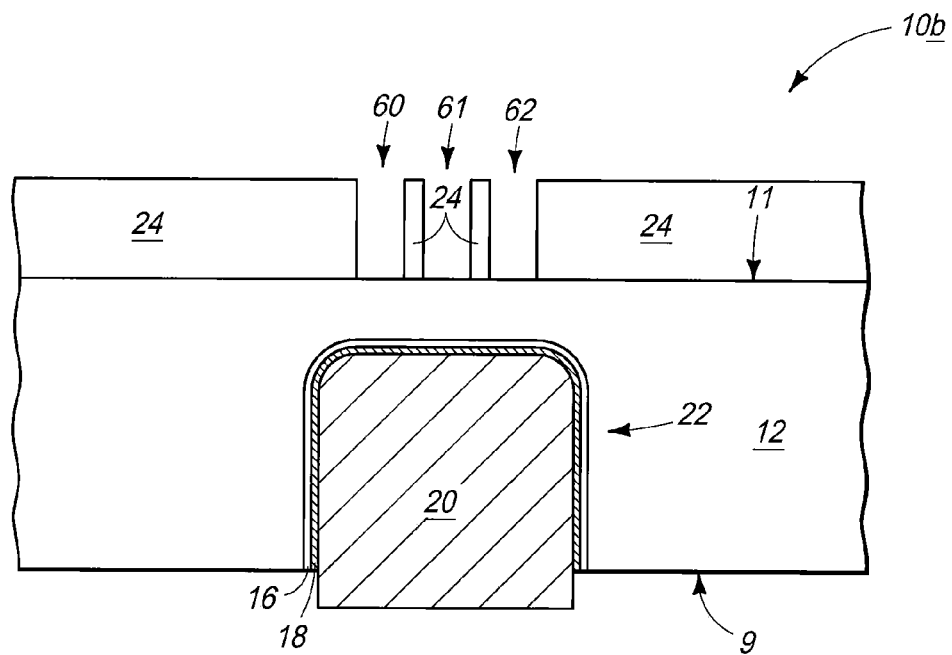
FIGS. 17-19, 21 and 22 are diagrammatic, cross-sectional views of a semiconductor construction at various process stages of another example embodiment method of forming a through-substrate interconnect. The process stage of FIG. 17 may follow that of FIG. 4, and may be alternative to that of FIG. 5.

Referring to FIG. 17, a construction 10b is shown at a processing stage analogous to that of FIG. 5. The construction 10b, like the construction 10 of FIG. 5, comprises the patterned masking material 24 formed across the second side 11 of substrate 12. However, unlike the construction of FIG. 5, the construction 10b of FIG. 17 has three openings 60-62 patterned through the masking material 24. The openings 60-62 are all directly over the first part 22 of the electrical interconnect. The embodiment of FIG. 17 is an example embodiment in which there are a plurality of openings patterned through the masking material. In other example embodiments, the plurality of openings may correspond to a different number of openings than the illustrated three openings. In some embodiments discussed below with reference to FIGS. 27-32 not all of the openings are directly over the first part of the electrical interconnect. Instead, some of the openings may be in locations where anchor pins are desired.

Figure 18:
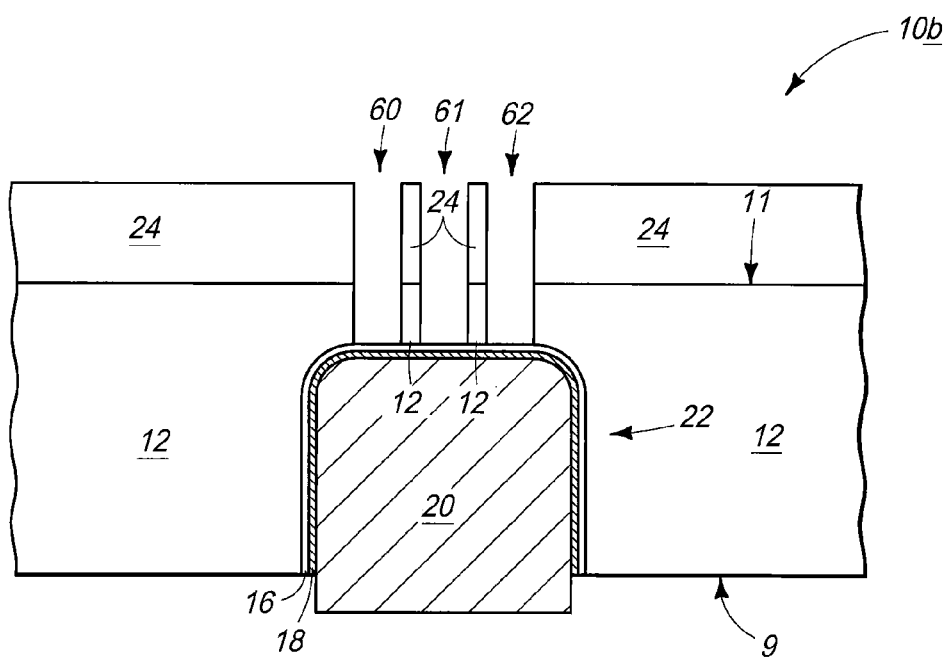

Referring to FIG. 18, construction 10*b* is subjected to processing analogous to that described above with reference to FIG. 6 to extend the openings 60-62 through substrate 12, and to the electrically insulative material 16.

Figure 19:
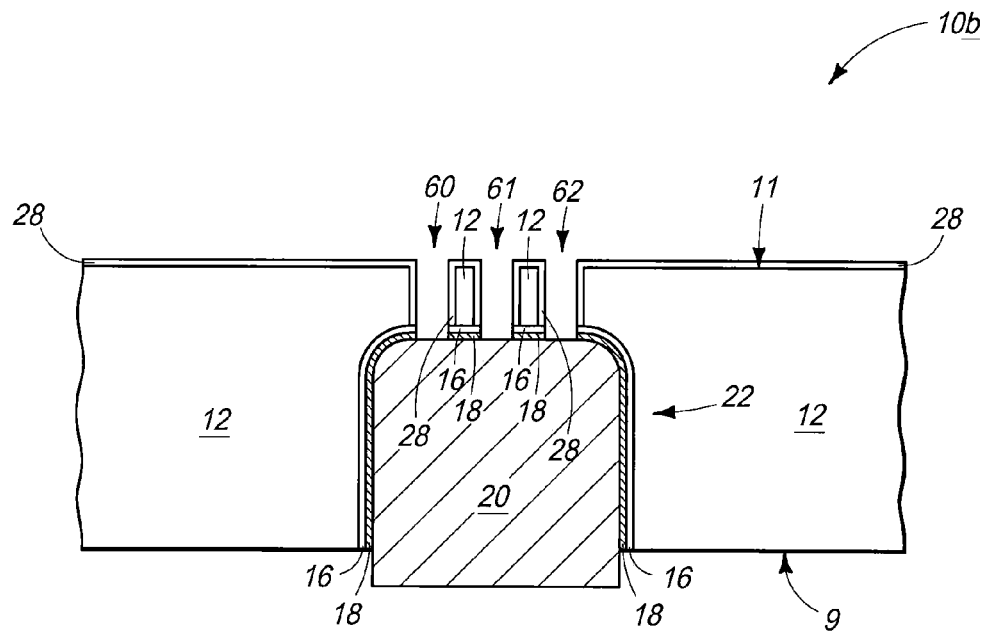

Referring to FIG. 19, construction 10*b* is shown at a processing stage analogous to that of FIG. 8. Specifically, the construction is shown after formation of the electrically insulative material 28 across the side 11 of the substrate and within the openings 60-62; and after etching to extend the openings 60-62 through materials 16 and 18 and to the core 20 of the first part of the interconnect.

Figure 20:
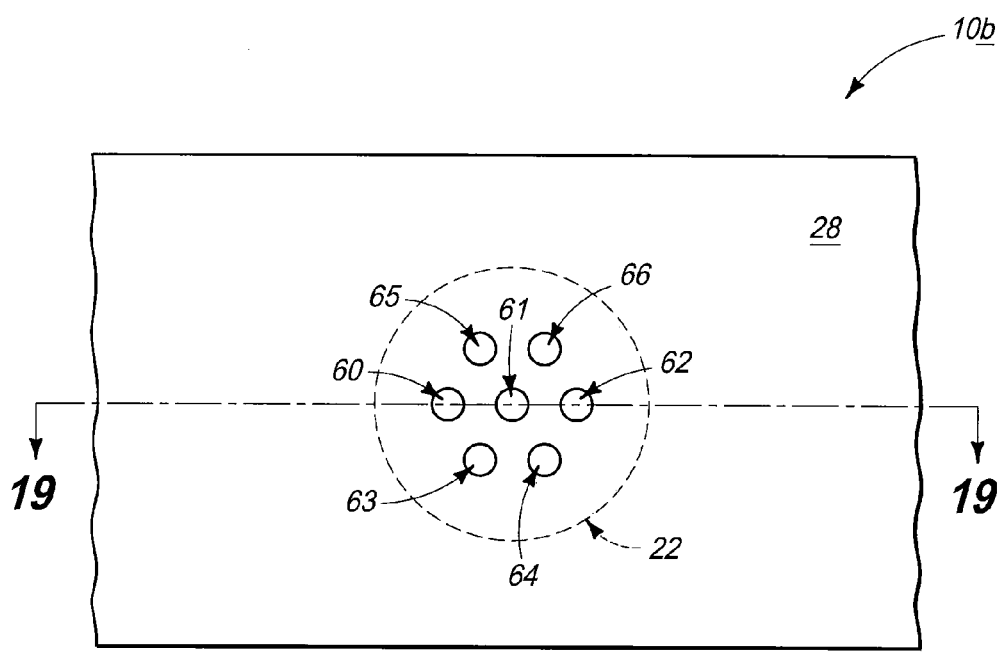
FIG. 20 is a diagrammatic top view of the construction of FIG. 19. The cross-section of FIG. 19 is along the line 19-19 of FIG. 20.

FIG. 20 shows a top view of the construction of FIG. 19, and shows the openings 60-62 relative to the first part 22 of the interconnect. The first part 22 is shown in dashed-line to indicate that such is beneath other materials. Additional openings 63-66 are visible in the top view of FIG. 19, besides the openings 60-62. All of the openings 60-66 are directly over the first part 22 of the interconnect; and accordingly all of such openings may be considered to be second openings which extend to the first part of the interconnect. Although the shown embodiment has seven openings formed over the first part 22 of the interconnect, in other embodiments there may be less than seven openings formed over the first part of the interconnect, or more than seven openings formed over such first part.

As discussed above with reference to FIG. 7, it can be desired that insulative material 28 be formed under conditions such that the insulative material is thicker over the outer surface of substrate 12 than at the bottoms of the openings extending into such substrate. Such conditions may utilize openings having suitably high aspect ratios so that deposition of material 28 at the bottoms of the openings is slower than the deposition of material 28 across the outer surface of substrate 12. A potential difficulty with the utilization of a single opening having a suitably high aspect ratio to achieve the desired deposition characteristics of material 28 is that the portion of the conductive interconnect ultimately formed within such opening may be too narrow to achieve desired conductance characteristics. The utilization of multiple openings in the embodiment of FIGS. 19 and 20 may enable suitably high aspect ratios to be achieved within the individual openings to enable the insulative material 28 to be formed thinner over bottoms of the openings than over the outer surface of substrate 12, and yet may enable enough conductive material to be formed within the combined multiple openings so that the resulting interconnect has desired conductance characteristics.

The multiple openings formed at the processing stage of FIGS. 19 and 20 may have approximately the same dimensions as one another (as shown). In other embodiments, one or more of the openings may have substantially different dimensions than one or more others of the openings.

Figure 21:
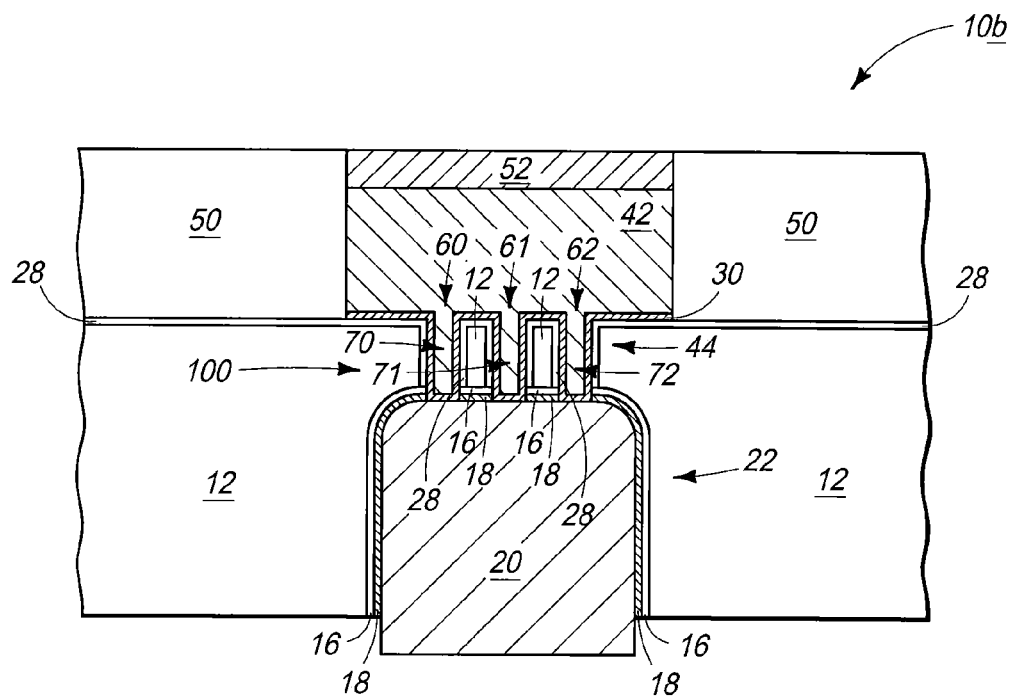

Referring to FIG. 21, construction 10*b* is shown at a processing stage analogous to that of FIG. 14. The construction comprises a through-substrate interconnect 100 having a first part 22 comprising core 20 and sheath 18, and having a second part 44 comprising core 42 and sheath 30. The second part 44 comprises multiple conductive fingers 70-72 within the openings 60-62, respectively. All of the conductive FIGS. 70-72 extend to the core 20 of the first part 22 of the through-substrate interconnect.

In some embodiments, core 20 and core 42 may both comprise the same metal-containing composition as one another; and may, for example, both consist of copper. In such embodiments, the cores 20 and 42 may be considered to be metal-containing cores comprising a first composition; and the sheath 30 may be considered to comprise a second composition, different from the first composition (for instance, the sheath 30 may comprise a copper barrier material), and directly between the metal-containing cores 20 and 42.

Figure 22:
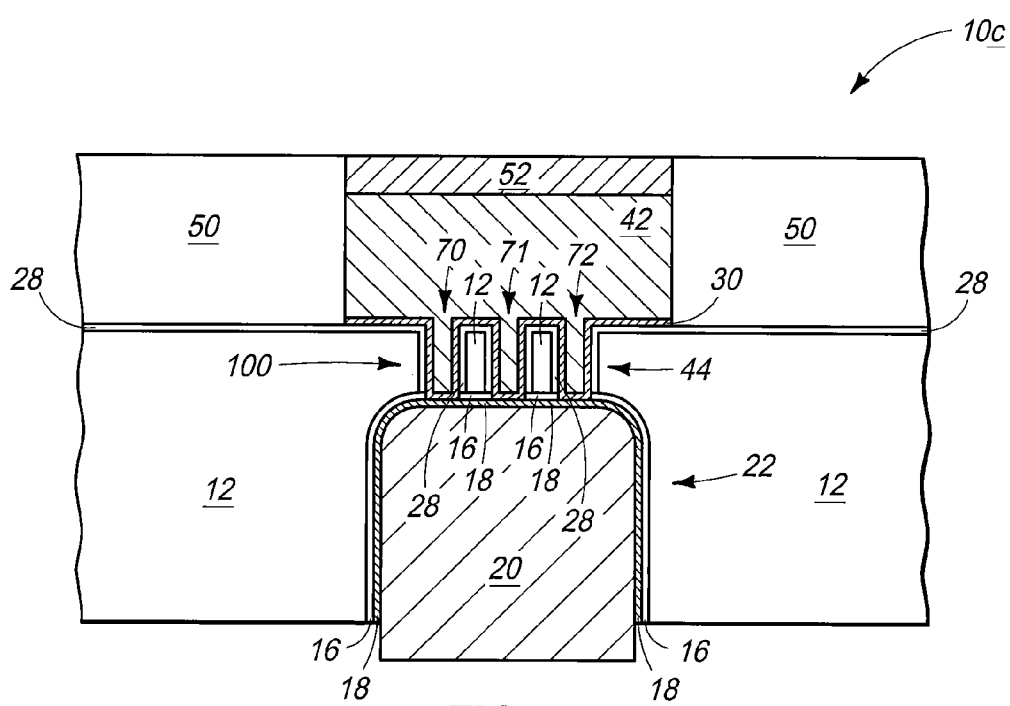

The fabrication stage of FIG. 21 shows the conductive fingers 70-72 extending to core 20. In other embodiments, the conductive fingers 70-72 may extend to the sheath 18, rather than entirely through such sheath to the core 20 (analogously to a construction discussed above with reference to FIGS. 15 and 16). FIG. 22 illustrates a construction 10*c* showing an example embodiment in which the conductive fingers 70-72 of the second part of the through-substrate interconnect 100 extend to the sheath 18 of the first part of the through-substrate interconnect. In some embodiments, the sheaths 18 and 30 may comprise the same composition as one another, and thus may merge to form a single layer between the conductive cores 42 and 20. In other embodiments, the sheaths 18 and 30 may comprise different compositions from one another.

Figure 23:
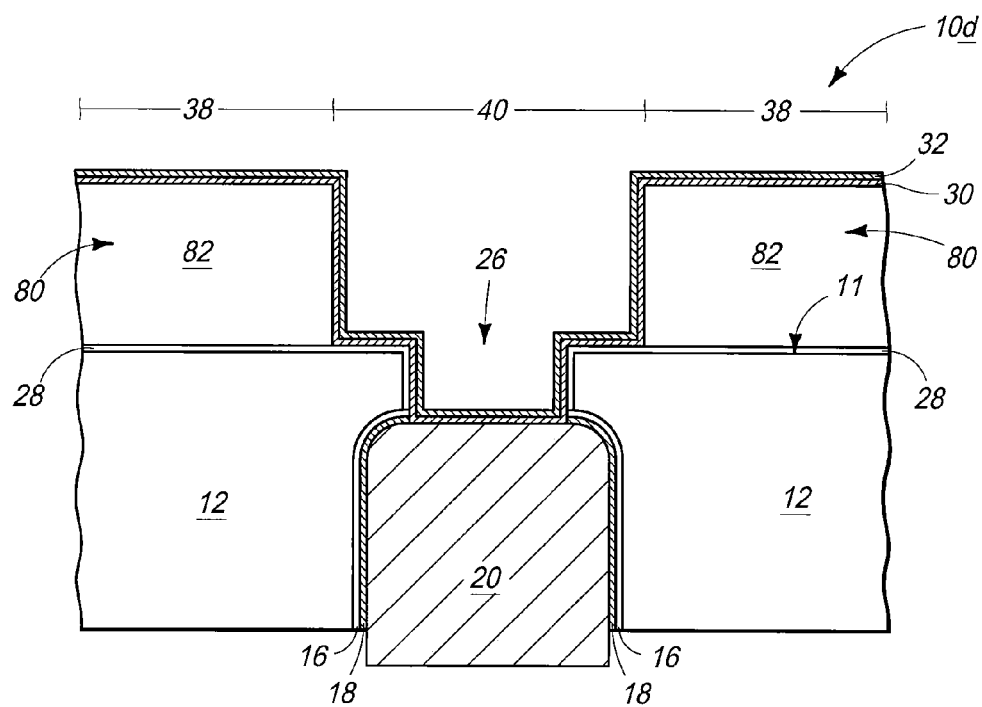
FIGS. 23-25 are diagrammatic, cross-sectional views of a semiconductor construction at various process stages of another example embodiment method of forming a through-substrate interconnect. The process stage of FIG. 23 may follow that of FIG. 8.
Figure 24:
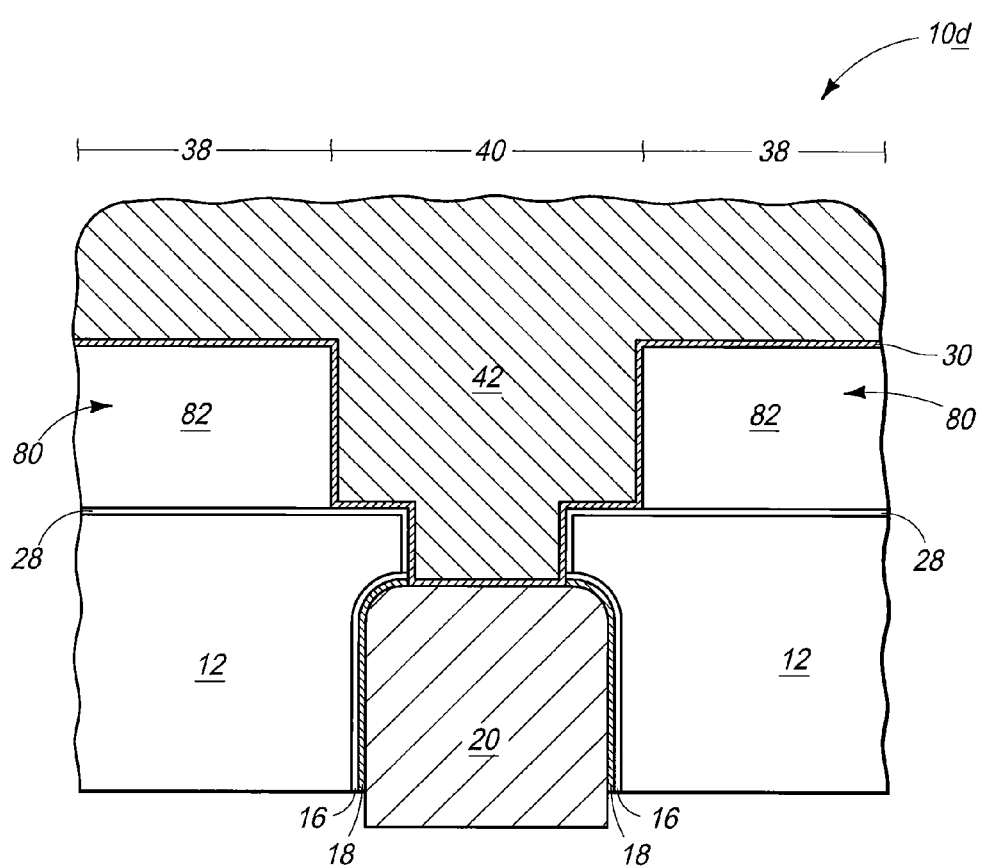
Figure 25:
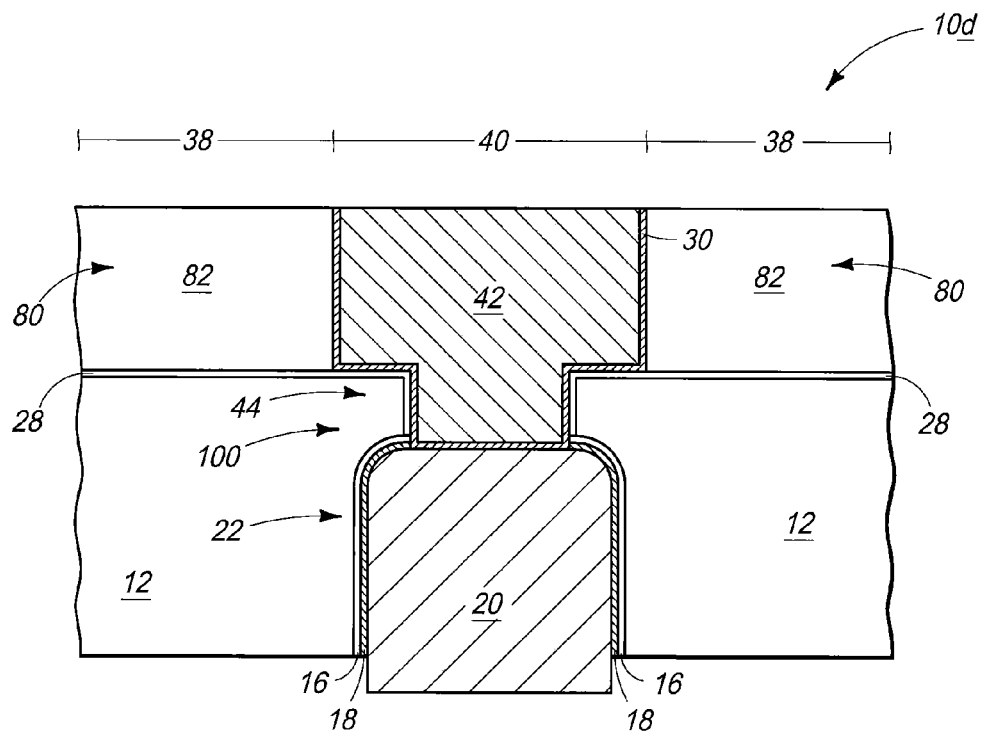

FIGS. 23-25 illustrate a method for patterning the second part of the through-substrate interconnect which may be utilized alternatively to the above-described patterning of FIGS. 10-14.

Referring to FIG. 23, a construction 10*d* is shown at a processing stage subsequent to that of FIG. 8. The construction is shown to comprise the first and second regions 38 and 40 discussed above with reference to FIG. 11. An electrically insulative structure 80 is patterned to be over the first region 38 of the substrate 12 of construction 10*d*, and not over the second region 40.

The electrically insulative structure comprises an electrically insulative material 82 which may comprise any suitable composition or combination of compositions; and in some embodiments may comprise, consist essentially of, or consist of polyimide. The electrically insulative material may be patterned into the configuration of structure 80 with any suitable processing. For instance, a photolithographically-patterned photoresist mask (not shown) may be formed over an expanse of material 82, a pattern may be transferred from the mask into the expanse of material 82 with one or more suitable etches, and then the mask may be removed to leave the illustrated patterned structure 80 of material 82.

Copper barrier material 30 and copper seed material 32 are formed over the insulative structure 80, and across the region 40 which is not covered by structure 80.

Referring to FIG. 24, copper-containing material 42 is formed across material 30. The copper-containing material may be electrolytically grown from the seed material 32 (FIG. 23). The seed material merges with the electrolytically-grown copper, and thus is not shown at the processing stage of FIG. 24.

Referring to FIG. 25, CMP and/or other suitable processing is utilized to remove the copper-containing material 42 and copper barrier material 30 from over the insulative material 82, while leaving the copper-containing material 42 over the second region 40 of the substrate. In subsequent processing (not shown) solder-wetting material analogous to the material 52 of FIG. 14 may be provided over the copper-containing material 42.

The construction of FIG. 25 has the second part 44 of the through-substrate interconnect 100 extending through the sheath 18 of the first part 22 of such interconnect. In other embodiments, similar processing to that of FIGS. 23-25 may be utilized to form constructions analogous to that of FIG. 16 in which the second part 44 of the electrical interconnect does not extend through the sheath 18 of the first part 22 of such electrical interconnect.

Figure 26:
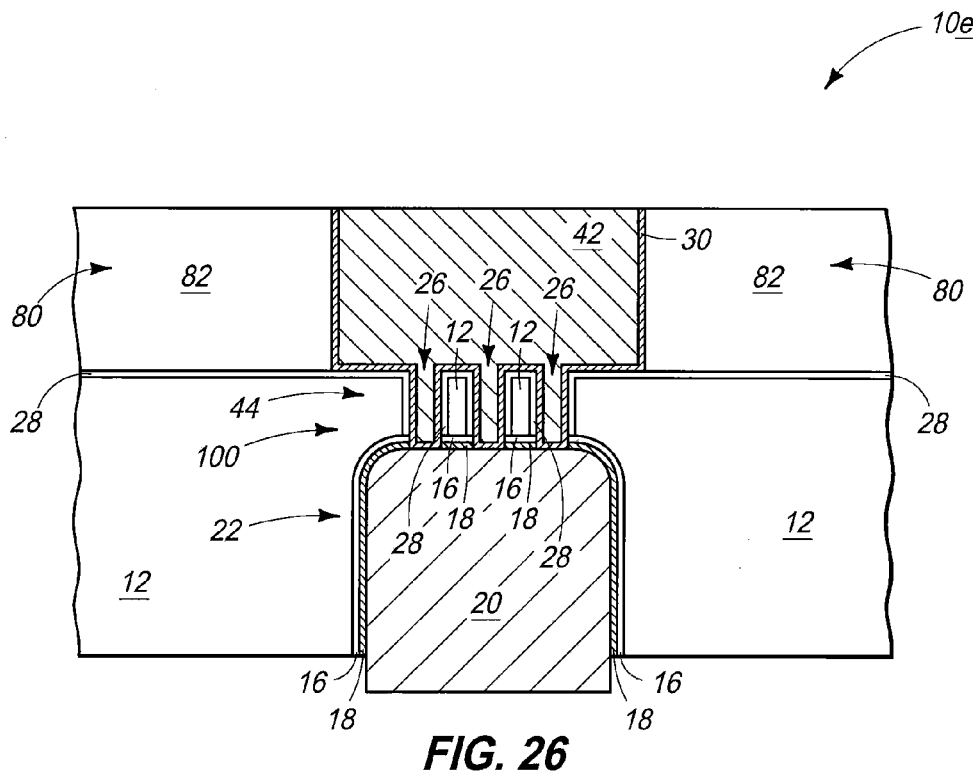
FIG. 26 is a diagrammatic, cross-sectional view of a semiconductor construction at a process stage of another example embodiment method of forming a through-substrate interconnect.

Processing similar to that of FIGS. 23-25 may be utilized during fabrication of interconnects analogous to those described above with reference to FIGS. 21 and 22 (i.e., interconnects comprising multiple conductive fingers). FIG. 26 shows a construction 10e formed with processing similar to that of FIGS. 23-25, and comprising a through-substrate interconnect 100 with multiple conductive fingers 70-72.

Although the portion 44 of the through-substrate interconnects described herein is referred to as a "second portion," and the portion 22 is referred to as an "first portion," in some embodiments the respective portions may be formed in an opposite order to that shown in the various figures provided herein. Thus, in some embodiments a multi-finger portion may be formed prior to another portion of a through-substrate interconnect.

Although the embodiments describe formation of a single interconnect comprising first and second portions, the embodiments may also be considered as forming twin interconnects that couple to one another at an interface located partway through a substrate.

The figures of this application show formation of individual through-substrate interconnects, but it is to be understood that such interconnects are representative of a large number of interconnects that may be simultaneously fabricated within a semiconductor substrate. Thus, it is to be understood that each of the individual interconnects shown in the figures may be representative of a large plurality of interconnects simultaneously fabricated within a substrate. Such plurality of interconnects may have any suitable arrangement across a substrate, and may, for example, have arrangements analogous to those described in U.S. Pat. No. 6,943,106, which lists Kirby as the inventor, and Micron Technology, Inc. as the assignee.

The embodiments of FIGS. 1-26 form through-substrate electrical interconnects. In other embodiments, anchor pins may be formed alongside the through-substrate interconnects during fabrication of the through-substrate interconnects. An example embodiment method for forming anchor pins is described with reference to FIGS. 27-31.

Figure 27:
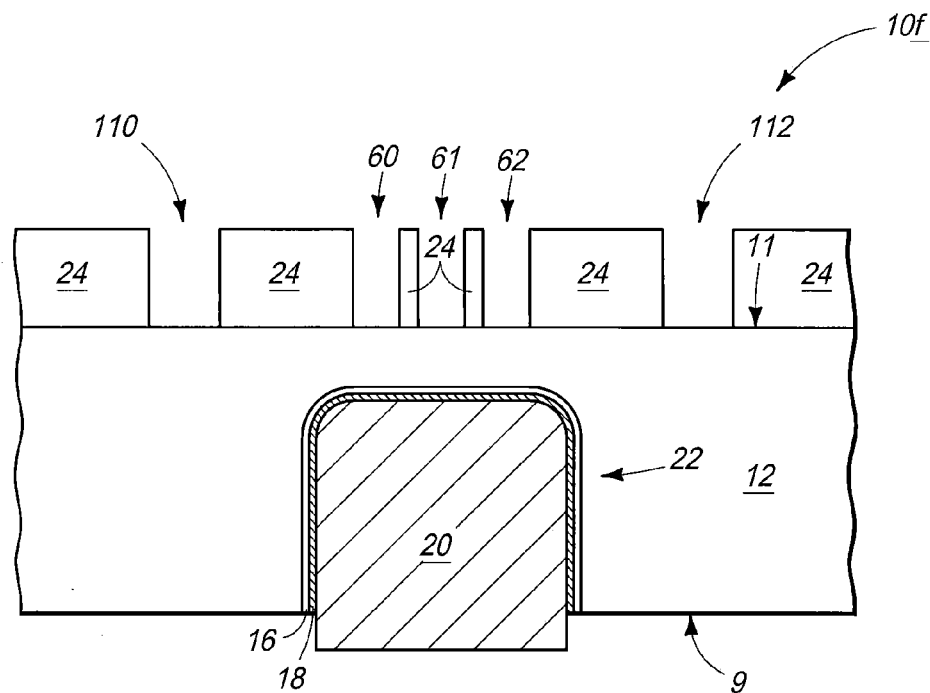
FIGS. 27-29 and 31 are diagrammatic, cross-sectional views of a semiconductor construction at various process stages of another example embodiment method. The process stage of FIG. 27 may follow that of FIG. 4.

Referring to FIG. 27, a construction 10f is shown at a processing stage analogous to that of FIG. 17. The construction 10f, like the construction 10 of FIG. 17, comprises the patterned masking material 24 formed across the second side 11 of substrate 12. However, unlike the construction of FIG. 17, the construction 10f of FIG. 27 has a pair of openings 110 and 112 patterned through the masking material 24 on opposing sides of the three openings 60-62. The openings 110 and 112 are laterally offset from the first part 22 of the electrical interconnect, and thus are not directly over such first part of the electrical interconnect. The embodiment of FIG. 27 is an example embodiment in which there is at least one opening patterned through the masking material in a location which is not directly over the first part of an electrical interconnect. In other embodiments, the number of openings that are not directly over such first part may correspond to a different number of openings than the illustrated pair of openings.

Figure 28:
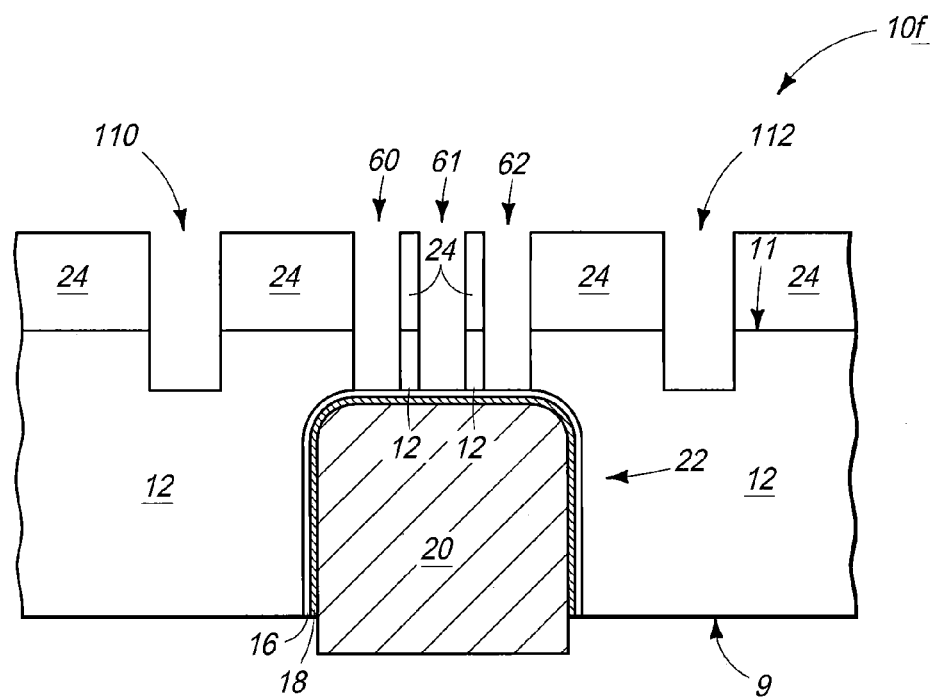

Referring to FIG. 28, construction 10f is subjected to processing analogous to that described above with reference to FIG. 18, and such processing extends the openings 110 and 112 into substrate 12.

Figure 29:
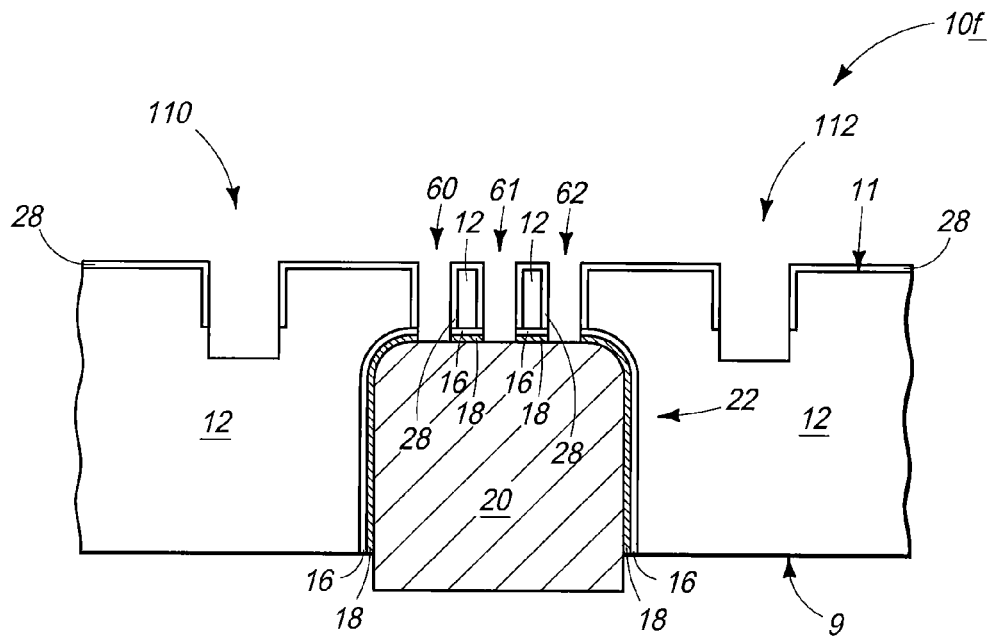

Referring to FIG. 29, construction 10f is shown at a processing stage analogous to that of FIG. 19. Specifically, the construction is shown after formation of the electrically insulative material 28 across the side 11 of the substrate and within the openings 60-62, 110 and 112; and after etching to extend the openings 60-62 through materials 16 and 18 and to the core 20 of the first part of the interconnect. Such etching may or may not also recess the openings 110 and 112 into the substrate 12 to a depth below bottom surfaces of insulative material 11 within such openings.

Figure 30:
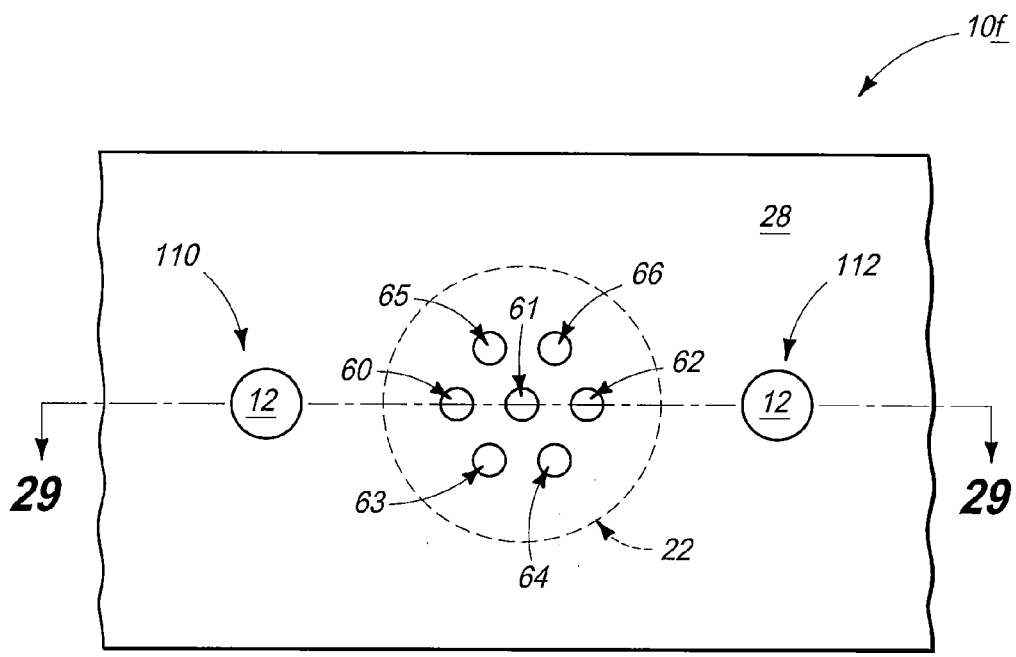
FIG. 30 is a diagrammatic top view of the construction of FIG. 29. The cross-section of FIG. 29 is along the line 29-29 of FIG. 30.

FIG. 30 shows a top view of the construction of FIG. 29, and shows the openings 60-62, 110 and 112 relative to the first part 22 of the interconnect. The first part 22 is shown in dashed-line to indicate that such is beneath other materials. Additional openings 63-66 are visible in the top view of FIG. 29, besides the openings 60-62, 110 and 112. All of the openings 60-66 are directly over the first part 22 of the interconnect, whereas the openings 110 and 112 are not directly over such first part of the interconnect.

The multiple openings formed at the processing stage of FIGS. 29 and 30 may have any suitable dimensions.

Figure 31:
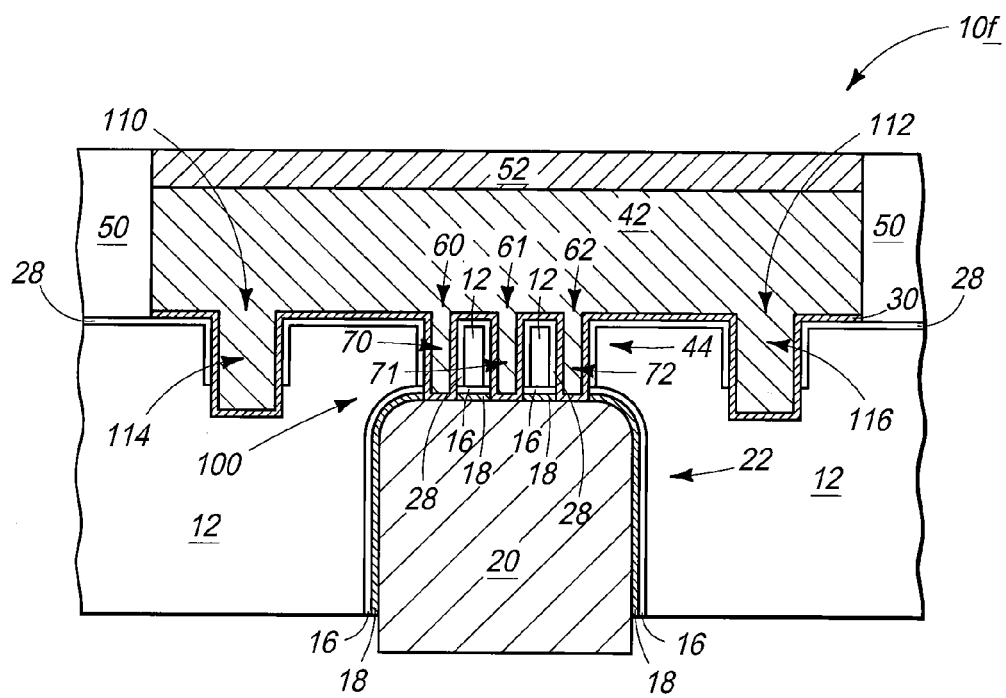

Referring to FIG. 31, construction 10f is shown at a processing stage analogous to that of FIG. 21. The construction comprises a through-substrate interconnect 100 having a first part 22 comprising core 20 and sheath 18, and having a second part 44 comprising core 42 and sheath 30. The second part 44 comprises multiple conductive fingers 70-72 within the openings 60-62, respectively. All of the conductive FIGS. 70-72 extend to the core 20 of the first part 22 of the through-substrate interconnect. The construction also comprises conductive material 42 extending into openings 110 and 112 to form anchor pins 114 and 116 extending into substrate 12. Such anchor pins may assist in retaining the pad of material 42 to the substrate. The number and spacing of the anchor pins may be chosen to achieve desired retention of the pad of material 42 to the substrate, while avoiding undesired weakening of the substrate.

Anchor pins analogous to those of FIG. 31 may be utilized in combination with any of the embodiments described herein.

Figure 32:
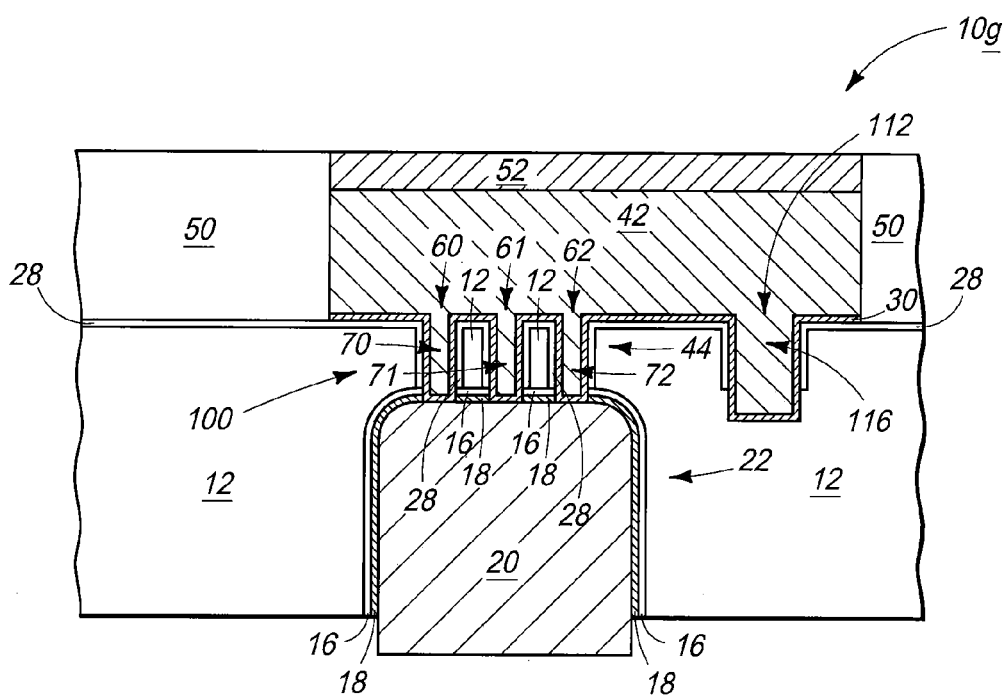
FIG. 32 is a diagrammatic, cross-sectional view of a semiconductor construction at a process stage of another example embodiment method.

Although the embodiment of FIG. 31 shows the pad of material 42 oriented somewhat symmetrically relative to the first part 22 of the electrical interconnect (and specifically shows the pad material 42 extending about the same distance to both the right and the left of the first part of the interconnect along the cross-section section of FIG. 31), in other embodiments the pad material may be oriented asymmetrically relative to such first part of the electrical interconnect. FIG. 32 shows a construction 10g in which the pad of material 42 is provided to be laterally offset relative to the first part 22 of the electrical interconnect. In the shown embodiment, the material 42 forms an anchor pin 116 extending into the opening 112. There may be some advantages to having the pad of material 42 laterally offset relative to the first part 22 of the electrical interconnect in some embodiments, in that such may enable redirection of various forces developed during thermal expansion.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include methods of forming interconnects through semiconductor substrates. A first opening may be formed to extend from one side of a semiconductor substrate, and partway through the substrate. A first part of an electrically conductive interconnect may be formed within the first opening. At least one second opening may be formed to extend from a second side of the substrate to the first part of the electrically conductive interconnect. A second part of the electrically conductive interconnect may be formed within the at least one second opening.

Some embodiments include methods of forming interconnects through semiconductor substrates. A first opening may be formed to extend from one side of a semiconductor substrate, and partway through the substrate. A first part of an electrically conductive interconnect may be formed within the first opening. At least one second opening may be formed to extend from a second side of the substrate and directly over the first part of the electrically conductive interconnect. Electrically insulative material may be formed along the second side of the substrate and within the at least one second opening. The electrically insulative material may be removed from along a bottom of the at least one second opening while leaving the electrically insulative material along the second side of the substrate and along sidewalls of the at least one second opening After the electrically insulative material is removed from along the bottom of the at least one second opening, a region of the first part of the interconnect is exposed through the at least one second opening. A second part of the electrically conductive interconnect may then be formed within the at least one second opening.

Some embodiments include semiconductor constructions having an electrically conductive first part of a through-substrate interconnect, with said first part extending from a first side of a semiconductor substrate and partially through the substrate. The semiconductor constructions may also have an electrically conductive second part of the through-substrate interconnect, with the second part extending from a second side of the substrate in opposing relation to the first side, and comprising multiple separate electrically conductive fingers that all extend to the electrically conductive first part.

Some embodiments include semiconductor constructions containing a first electrically conductive part of a through-substrate interconnect, with said first part extending from a first side of a semiconductor substrate and partially through the substrate, and having a first metal-containing core. The semiconductor constructions may also contain a second electrically conductive part of the through-substrate interconnect, with the second part extending from a second side of the semiconductor substrate in opposing relation to the first side, with the second part having an electrically conductive sheath around a metal-containing core, and with the electrically conductive sheath of the second part being between the conductive core of the first part and the conductive core of the second part.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an interconnect through a semiconductor substrate, comprising:
   forming a first opening through a first side of the substrate and only partially through the substrate, the substrate comprising a second side opposite to the first side;
   forming a first part of an electrically conductive interconnect within the first opening;
   forming at least one second opening through the second side of the substrate, through a portion of the substrate and through a portion of the first part of the electrically conductive interconnect leaving sidewalls of the first part establishing a portion of the at least one second opening; and
   wherein:
      the forming of the first part of the electrically conductive interconnect comprises forming conductive layer over conductive material; and
      the forming of the at least one second opening comprises extending the at least one second opening through the conductive layer to the conductive material.

2. The method of claim 1 further comprising forming at least one anchor pin extending into the substrate.

3. The method of claim 1 wherein the conductive material of the electrically conductive interconnect comprises a copper core, and wherein the at least one second opening is extended to expose said copper core.

4. The method of claim 3 wherein there is only one second opening extending to the conductive material of the electrically conductive interconnect.

5. The method of claim 3 wherein there are multiple second openings extending to the conductive material of the electrically conductive interconnect.

6. The method of claim 1 wherein the conductive layer of the electrically conductive interconnect comprises an electrically conductive sheath around the conductive material.

7. The method of claim 6 wherein the electrically conductive sheath is a copper barrier material.

8. The method of claim 1 further comprising forming a single layer of electrically insulative material along the second side of the substrate and within the at least one second opening.

9. The method of claim 1 further comprising forming a second part of the electrically conductive interconnect within the at least one second opening.

10. The method of claim 1 further comprising forming a second part of the electrically conductive interconnect within the at least one second opening, the forming of the second part comprises:
    forming a copper barrier material across the second side of the substrate and within the at least one second opening;
    forming copper seed material over the copper barrier material;

forming a patterned mask covering a first region of the second side of the substrate while leaving a second region of the second side of the substrate uncovered; the at least one second opening being within the uncovered second region;

electrolytically growing copper from the seed material within the uncovered second region; and after electrolytically growing the copper, removing the patterned mask, the seed material and the copper barrier material from over the first region.

11. The method of claim 10 wherein the copper remains as a pedestal over the second region after removing the patterned mask, the seed material and the copper barrier material from over the first region; and further comprising forming an electrically insulative structure across the first region and along sidewalls of said pedestal.

12. The method of claim 10 further comprising forming at least one anchor pin extending into the substrate during the formation of the second part of the electrically conductive interconnect, and wherein the at least one anchor pin comprises the electrolytically grown copper.

13. The method of claim 1 further comprising forming a second part of the electrically conductive interconnect within the at least one second opening, the forming of the second part comprises:

forming an electrically insulative structure to cover a first region of the second side of the substrate while leaving a second region of the second side of the substrate uncovered; the at least one second opening being within the uncovered second region;

forming a copper barrier material across the electrically insulative structure and within the at least one second opening;

forming copper over the copper barrier material; and removing the copper and the barrier material from over the electrically insulative structure, while leaving the copper and the barrier material over the second region.

14. The method of claim 13 wherein the electrically insulative structure comprises polyimide.

15. The method of claim 13 wherein the removing of the copper and the barrier material from over the electrically insulative structure comprises chemical-mechanical polishing.

16. The method of claim 1 further comprising forming an insulative layer between the at least one second opening and the first part of the electrically conductive interconnect.

17. The method of claim 1 further comprising:

forming a first insulative layer between the at least one second opening and the first part of the electrically conductive interconnect; and forming a second insulative layer in the at least one second opening to contact the first insulative layer.

18. The method of claim 8 wherein the forming of the single layer comprising electrically insulative material is formed in a single method step.

19. The method of claim 1 further comprising forming an insulative layer in the first opening over the conductive layer.

20. The method of claim 19 wherein the forming of the at least one second opening comprises extending the at least one second opening through the insulative layer and through the conductive layer.

21. The method of claim 8 further comprising forming the single layer of the electrically insulative material along a bottom of the at least one second opening, the single layer is formed to be thicker along the second side of the substrate than along the bottom of the at least one second opening.

22. The method of claim 9 wherein the forming of the second part of the electrically conductive interconnect comprises electrolytically growing copper within the at least one second opening.

23. The method of claim 1 further comprising forming a second part of the electrically conductive interconnect within the at least one second opening, wherein the forming of the second part comprises forming a copper barrier material across the second side of the substrate and within the at least one second opening.

24. The method of claim 23 wherein the forming of the second part further comprises forming copper seed material over the copper barrier material.

25. The method of claim 24 wherein the forming of the second part further comprises forming a patterned mask covering a first region of the second side of the substrate while leaving a second region of the second side of the substrate uncovered; the at least one second opening being within the uncovered second region.

26. The method of claim 25 wherein the forming of the second part further comprises electrolytically growing copper from the seed material within the uncovered second region.

* * * * *

UNITED STATES PATENT AND TRADEMARK OFFICE
CERTIFICATE OF CORRECTION

PATENT NO. : 8,853,072 B2  
APPLICATION NO. : 13/154132  
DATED : October 7, 2014  
INVENTOR(S) : Alan G. Wood et al.

Page 1 of 1

It is certified that error appears in the above-identified patent and that said Letters Patent is hereby corrected as shown below:

In the Claims,

In column 12, line 31, in Claim 1, after "forming" insert -- a --.

Signed and Sealed this  
Twenty-third Day of December, 2014

Michelle K. Lee  
*Deputy Director of the United States Patent and Trademark Office*